US007056455B2

(12) United States Patent
Matyjaszewski et al.

(10) Patent No.: US 7,056,455 B2
(45) Date of Patent: Jun. 6, 2006

(54) PROCESS FOR THE PREPARATION OF NANOSTRUCTURED MATERIALS

(75) Inventors: Krzysztof Matyjaszewski, Pittsburgh, PA (US); Tomasz Kowalewski, Pittsburgh, PA (US); David N. Lambeth, Pittsburgh, PA (US); James Spanswick, Wheaton, IL (US); Nicolay V. Tsarevsky, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 448 days.

(21) Appl. No.: 10/118,519

(22) Filed: Apr. 6, 2002

(65) Prior Publication Data

US 2003/0185741 A1 Oct. 2, 2003

Related U.S. Application Data

(60) Provisional application No. 60/282,132, filed on Apr. 6, 2001.

(51) Int. Cl.
*D01F 9/12* (2006.01)

(52) U.S. Cl. .............. 264/29.2; 423/447.1; 521/61; 521/62; 521/63; 521/77; 521/918; 521/919; 502/527.24

(58) Field of Classification Search ............. 423/447.1, 423/447.2; 428/367; 264/29.2; 521/61–63, 521/77, 918, 919; 502/527.24
See application file for complete search history.

(56) References Cited

U.S. PATENT DOCUMENTS

| 3,183,217 | A |   | 5/1965  | Serniuk et al.   |         |
|-----------|---|---|---------|------------------|---------|
| 3,959,225 | A |   | 5/1976  | Kuntz            |         |
| 4,007,165 | A |   | 2/1977  | MacLeay et al.   |         |
| 4,073,870 | A |   | 2/1978  | Saji et al.      |         |
| 4,374,751 | A |   | 2/1983  | Dudgeon          |         |
| 4,728,706 | A |   | 3/1988  | Farnham et al.   |         |
| 4,940,648 | A |   | 7/1990  | Geiger           |         |
| 4,954,416 | A |   | 9/1990  | Wright et al.    |         |
| 5,089,135 | A |   | 2/1992  | Yoneyama et al.  |         |
| 5,169,914 | A |   | 12/1992 | Kaszas et al.    |         |
| 5,312,871 | A |   | 5/1994  | Mardare et al.   |         |
| 5,405,913 | A |   | 4/1995  | Harwood et al.   |         |
| 5,451,647 | A |   | 9/1995  | Faust et al.     |         |
| 5,470,928 | A |   | 11/1995 | Harwood et al.   |         |
| 5,510,212 | A | * | 4/1996  | Delnick et al.   | 429/231.4 |
| 5,510,307 | A |   | 4/1996  | Narayanan et al. |         |
| 5,558,954 | A | * | 9/1996  | Morrison         | 429/231.8 |
| 5,668,188 | A | * | 9/1997  | Whinnery et al.  | 423/345 |
| 5,763,548 | A |   | 6/1998  | Matyjaszewski et al. |     |
| 5,789,487 | A |   | 8/1998  | Matyjaszewski et al. |     |
| 5,807,937 | A |   | 9/1998  | Matyjaszewski et al. |     |
| 5,910,549 | A |   | 6/1999  | Matyjaszewski et al. |     |
| 5,945,491 | A |   | 8/1999  | Matyjaszewski et al. |     |
| 6,054,507 | A | * | 4/2000  | Funaki et al.    | 523/210 |
| 6,111,022 | A |   | 8/2000  | Matyjaszewski et al. |     |
| 6,121,371 | A |   | 9/2000  | Matyjaszewski et al. |     |
| 6,124,411 | A |   | 9/2000  | Matyjaszewski et al. |     |
| 6,162,882 | A |   | 12/2000 | Matyjaszewski et al. |     |
| 6,288,186 | B1|   | 9/2001  | Matyjaszewski et al. |     |
| 6,407,187 | B1|   | 6/2002  | Matyjaszewski et al. |     |
| 6,512,060 | B1|   | 1/2003  | Matyjaszewski et al. |     |
| 6,538,091 | B1|   | 3/2003  | Matyjaszewski et al. |     |
| 6,541,580 | B1|   | 4/2003  | Matyjaszewski et al. |     |

(Continued)

FOREIGN PATENT DOCUMENTS

EP           0 576 198         12/1993

(Continued)

OTHER PUBLICATIONS

U.S. Appl. No. 10/269,556 filed Oct. 11, 2002.

(Continued)

*Primary Examiner*—Stanley S. Silverman
*Assistant Examiner*—Peter J. Lish
(74) *Attorney, Agent, or Firm*—Kirkpatrick & Lockhart Nicholson Graham LLP

(57) ABSTRACT

The present invention comprises a novel process for the preparation of carbon based structured materials with controlled topology, morphology and functionality. The nanostructured materials are prepared by controlled carbonization, or pyrolysis, of precursors comprising phase separated copolymers. The precursor materials are selected to phase separate and self organize in bulk, in solution, in the presence of phase selective solvents, at surfaces, interfaces or during fabrication, into articles, fibers or films exhibiting well-defined, self-organized morphology or precursors of well-defined, self-organized, bi- or tri-phasic morphology. Compositional control over the (co)polymers provides control over the structure of the phase separated precursor whose organization therein dictates the nanostructure of the material obtained after carbonization or pyrolysis, wherein each dimension of the formed structure can be predetermined. When the precursor morphology is selected to comprise cylindrical domains this procedure additionally allows for the direct formation of two dimensional nanowire grids or arrays of oriented nanostructures on surfaces. When these nanowire grids or arrays are perpendicularly oriented to the surface applications include field emitters, high surface area electrodes, electronic devices such as diodes and transistors, tools for AMF tips and elements of molecular electronics. When the first nanostructured morphology is selected to form cylinders parallel to the surface then nanowire arrays are formed after pyrolysis. When the composition of the first nanostructured morphology is selected to comprise a continuous precursor matrix then a continuous carbon based nanostructured material is formed. The internal structure of the carbon based material can be selected to comprise perpendicular pores or an interconnected array of pores. The carbon based structures can additionally find application in photovoltaics, supercapacitors, batteries, fuel cells, computer memory, carbon electrodes, carbon foams, actuators and hydrogen storage.

92 Claims, 18 Drawing Sheets

U.S. PATENT DOCUMENTS

| | | | |
|---|---|---|---|
| 6,565,763 B1* | 5/2003 | Asakawa et al. | 216/56 |
| 6,592,991 B1* | 7/2003 | Wiesner et al. | 428/404 |
| 6,624,262 B1 | 9/2003 | Matyjaszewski et al. | |
| 6,624,263 B1 | 9/2003 | Matyjaszewski et al. | |
| 6,627,314 B1 | 9/2003 | Matyjaszewski et al. | |

FOREIGN PATENT DOCUMENTS

| | | |
|---|---|---|
| EP | 0870809 | 10/1998 |
| WO | WO 98/01480 | 1/1998 |
| WO | WO 00/56795 | 9/2000 |

OTHER PUBLICATIONS

U.S. Appl. No. 09/359,359 filed Jul. 23, 1999.
U.S. Appl. No. 09/534,827 filed Mar. 23, 2000.
U.S. Appl. No. 09/972,056 filed Oct. 5, 2001.
U.S. Appl. No. 10/034,908 filed Dec. 21, 2001.
U.S. Appl. No. 10/271,025 filed Oct. 15, 2002.
U.S. Appl. No. 10/289,545 filed Nov. 7, 2002.
Dorota Greszta et al., "Gradient Copolymers of Styrene and Acrylonitrille Via Atom Transfer Radical Polymerization", Polymer Preprints, Apr. 1997, pp. 709-710, vol 38 (1).
Gromada, J.; Matyjaszewski, K. Macromolecules 2001, 34, 7664-7671.
Jin-Shan Wang and Krzysztof Matyjaszewski, "Controlled/ "Living"Radical Polymerization. Atom Transfer Radical Polymerization in the Presence of Transition-Metal Complexes". Reprinted form the Journal of the American Chemical Society, 1995, vol. 117, No. 20.
Jin-Shan Wang and Krzysztof Matyjaszewski, "Controlled/ "Living"Radical Polymerization. Halogen Atom Transfer Radical Polymerization Promoted by a Cu(I)/Cu(II) Redox Process". Reprinted from Macromolecules, 1995, 28. Department of Chemistry, Carnegie Mellon University. Received May 2, 1995; Revised Manuscript Received Aug. 14, 1995.
Krzysztof Matyjaszewski, Mingli Wei, Jianhui Xia and Nancy E. McDermott, "Controlled/"Living "Radical Polymerization of Styrene and Methly Methacrylate Catalyzed by Iron Complexesl", Macromolecules, vol. 30, No. 26, 1997.
Krzysztof Matyjaszewski, Simion Coca, Scott G. Gaynor, Mingli Wei and Brian E. Woodworth, "Zerovalent Metals in Controlled/"Living"Radical Polymerization", Macromolecules, 1997, pp. 7348-7350, vol. 30, No. 23.
Matyjaszewski, K.; Editor Controlled/Living Radical Polymerization. Progress in ATRP, NMP, and RAFT. In: ACS Symp. Ser., 2000; 768, 2000., Chapter 19 "Reverse Atom Transfer Radical Polymerization Using AIBN or BPO as Initiator" pp. 263-275.
Matyjaszewski, K.; Xia, J. Chem. Rev. 2001, 101, 2921-2990.
Mingli Wei, Jianhui Xia, Nancy E. McDermott and Krzysztof Matyjaszewski, "Atom Transfer Radical Polymerization of Styrene in the Presence of Iron Complexes", Polymer Preprints, 38(2), 231 (1997), Department of Chemistry, Carnegie Mellon University.

Qui, J.; Matyjaszewski, K; Thouin, L.; Amatore, C. Macromol. Chem. Phys. 2000, 201, 1625-1631.
Queffelec, J.; Gaynor, S.G.; Matyjaszewski, K. Macromolecules 2000, 33, 8629-8639.
Simion Coca, Christina B. Jasieczek, Kathryn L. Beers and Krzysztof Matyjaszewski, "Polymerization of Acrylates by Atom Transfer Radical Polymerization. Homopolymerization of 2-Hydroxyethyl Acrylate", Journal of Polymer Science, 1998, pp. 1417-1424, vol. 36, Part A: Polymer Chemistry.
Seong Mu Jo et al, "Polyacrylonitrile with Low Polydispersities by Atom Transfer Radical Polymerization", Polymer Preprints, vol. 38(1) Apr. 1997, pp. 697-698.
Seong Mu Jo et al, "Effects of Various Copper Salts and Additives on Polymerization of Acrylonitrile by Atom Transfer Radical Polymerization", Polymer Preprints, vol. 38(1) Apr. 1997, pp. 699-700.
Timothy E. Patten and Krzysztof Matyjaszewski, Atom Transfer Radical Polymerization and the Synthesis of Polymeric Materials, Advanced Materials 1998 10 No. 12, 901-915.
T.E. Patten et al., "Polymers with very Low Polydispersities from Atom Transfer Radical Polymerization", Science, vol. 272, pp. 866-868, May 10, 1996.
U. Schubert et al., "Design of Effective Systems for Controlled Radical Polymerization of Styrene: Application of 4,4'-Dimethyl and 5,5'-Dimethyl 2,2'-Bipyridine Copper(ii) Complexes", Macromol. Rapid Commun., vol. 20, No. 6, pp. 351-355, 1999.
Wang et al., "Living/Controlled Radical Polymerization, Transition-Metal-Catalyzed Atom Transfer Radical Polymerization in the Presence of a Conventional Radical Initiator", Macromolecules, 1995, vol. 28, pp. 7572-7573.
Wang, J.-S.; Matyjaszewski, K., J. Am. Chem. Soc. 1995, 117, 5614-5615.
Xia J. and Matyjaszewski K., "Controlled/"Living"Radical Polymerization. Homogenous Reverse Atom Transfer Radical Polymerization Using AIBN as the Initiator," Macromolecules, 1997, pp. 7692-7696, vol. 30.
"Pryolytic Behavior and In-Situ Paramagnetism of Star-like C60(CH3)x(PAN)xcopolymers", European Polymer Journal, Elsevier Science Ltd., Oxford, GB, vol. 34, No. 3-4, Mar. 1, 1998, pp. 421-429, Chen et al.
"Polyimide Nanofoams From Phase-Separated Block Copolymers", Electrochemical Society Proceedings, Electrochemical Society, Pennington, NJ, US, vol. 97, No. 8., 1997, pp. 32-43, Carter et al.
"Preparation of Porous Carbon Films by the Pyrolysis of Poly(Urethane-imide) Films and Their Pore Characteristics", Carbon, vol. 39, No. 2, Feb. 2001, pp. 257-265, Takeichi et al.
"Nano-Structured Polymer Blends: Phase Structure, Crystallisation Behaviour and Semi-Crystalline Morphology of Phase Separated Binary Blends of Poly(ethylene oxide) and Poly(ether sulphone)", Polymer, Elsevier Science Publishers B.V., GB, vol. 41, No. 4, Feb. 2000, pp. 1395-1407, Dreezen et al.

* cited by examiner

FIG. 7A
FIG. 7B
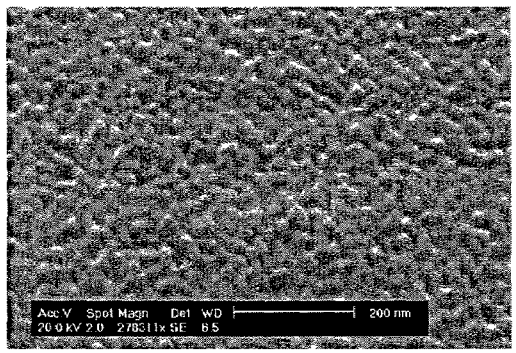
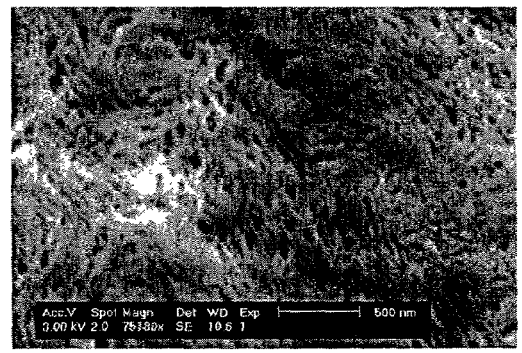
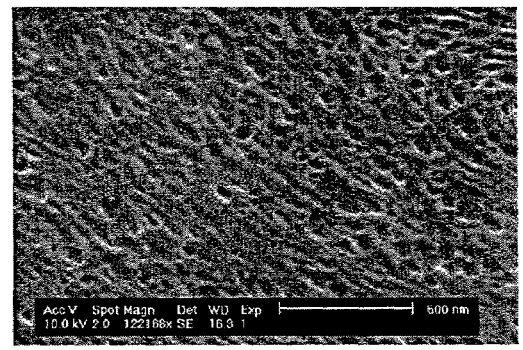
FIG. 7C

Self assembly

Scheme 1

Pyrolysis

Carbon Nanostructures

Applications

Supercapacitors

Photovoltaic cells

Double Layer Capacitors
(Adsorbed layers of ions and solvated ions)

a) b)

PROCESS FOR THE PREPARATION OF NANOSTRUCTURED MATERIALS

This application claims benefit of Provisional Application No. 60/282,132, filed

FIELD OF THE INVENTION

The present invention relates to a method of producing carbon based materials with uniform composition, structural morphology and functionality. More particularly, the present invention relates to a method of producing nanostructured carbon based materials, such as for example, carbon nanotubes, carbon nanocylinders, nanofibers, arrays of nanotubes and carbon based structures such as fibers, films, free standing carbon based materials with nanopores of regular dimensions, and composites comprising carbon based nanostructures.

BACKGROUND OF THE INVENTION

Carbon nanostructures are a new class of materials that potentially have a wide range of applications. Typically, carbon nanostructures have a length from about 0.01 mm to about 0.1 mm and have a diameter of about 10 nm to about 100 nm. Carbon nanostructures, such as carbon nanotubes, have a unique combination of properties that may allow the development of new products and improvements in existing products. Potential applications for carbon nanostructures include microelectronics, scanning probes and sensors, field emission devices such as video and computer displays and nanoelectronics. Most-promising near-term applications include electromagnetic shielding and electron field emission displays for computers and other high-tech devices and in applications requiring improved heat transfer and thermal insulation properties. Longer range target applications include photovoltaics, supercapacitors, batteries, fuel cells, computer memory, carbon electrodes, carbon foams, actuators, materials for hydrogen storage, adsorbants and as supports. Carbon nanotubes have such wide applicability due to their many unique mechanical, electrical and chemical properties. These properties include electrical conductivity, mechanical strength and thermal conductivity. For instance, carbon nanotubes may have mechanical strength of 10 to 100 times the strength of steel, but at a fraction of the weight. Carbon nanotubes additionally demonstrate remarkably consistent electrical behavior. In fact, they exhibit an essentially metallic behavior and conduct electricity over well-separated electronic states while remaining coherent over the distances needed to interconnect various molecular computer components. Therefore, a wire produced from carbon nanotubes may potentially be used to connect molecular electronic components.

Carbon nanostructures may be produced in many different morphologies, including single walled tubes, multiwalled tubes, ribbons, sheets, as well as more complex morphologies. Strong van der Waals attraction forces additionally allow spontaneous roping of nanostructures leading to the formation extended carbon based structures.

Presently, there are several different process for the preparation of carbon nanotubes. Nanotubes may produced on a limited scale by a process utilizing arc discharge as described by Ebbesen, T. W.; Ajayan, P. M.; Nature (London), 1992; Vol. 358, pp 220–222; Iijima, S. In Nature (London), 1991; Vol. 354, pp 56–58; Bethune, D. S.; Kiang, C. H.; de Vries, M. S.; Gorman, G.; Savoy, R.; Vazquez, J.; Beyers, R.; Nature (London), 1993; Vol. 363, pp 605–607; Iijima, S.; Ichihashi, T.; Nature 1993, 363, 603–605; a process comprising laser ablation is described by Rinzler, A. G.; Liu, J.; Dai, H.; Nikolaev, P.; Huffman, C. B.; Rodriguez-Macias, F. J.; Boul, P. J.; Lu, A. H.; Heymann, D.; Colbert, D. T.; Lee, R. S.; Fischer, J. E.; Rao, A. M.; Eklund, P. C.; Smalley, R. E. In Appl. Phys. A: Mater. Sci. Process., 1998; Vol. A67, pp 29–37; Thess, A.; Lee, R.; Nikolaev, P.; Dai, H.; Petit, P.; Robert, J.; Xu, C.; Lee, Y. H.; Kim, S. G.; Rinzler, A. G.; Colbert, D. T.; Scuseria, G. E.; Tomanek, D.; Fischer, J. E.; Smalley, R. E. Science 1996, 273, 483–487; by pyrolysis of bulk polymers by Cho, W.-S.; Hamada, E.; Kondo, Y.; Takayanagi, K.; Appl. Phys. Lett., 1996; Vol. 69, pp 278–279; U.S. Pat. No. 6,156,256 describes the production of carbon nanofibers directly from hydrocarbons in a gas phase reaction upon contact with a catalytic metal particle when heated to about 1000° C. in a non-oxidizing gas stream; and a process comprising the chemical vapor deposition (CVD) of carbon by Jose-Yacaman, M.; Miki-Yoshida, M.; Rendon, L.; Santiesteban, J. G. In Appl. Phys. Lett., 1993; Vol. 62, pp 657–659; Ren, Z. F.; Huang, Z. P.; Xu, J. W.; Wang, J. H.; Bush, P.; Siegal, M. P.; Provencio, P. N. Science 1998, 282, 1105–1107; Huang, S.; Mau, A. W. H.; Turney, T. W.; White, P. A.; Dai, L. In J. Phys. Chem. B, 2000; Vol. 104, pp 2193–2196; Huang, S.; Dai, L.; Mau, A. W. H. In J. Phys. Chem. B, 1999; Vol. 103, pp 4223–4227.

The CVD processes have also been used to prepare ordered arrays of carbon nanotubes, Xie, S. S.; Chang, B. H.; Li, W. Z.; Pan, Z. W.; Sun, L. F.; Mao, J. M.; Chen, X. H.; Qian, L. X.; Zhou, W. Y. In Adv. Mater. (Weinheim, Ger.), 1999; Vol. 11, pp 1135–1138; Rohmund, F.; Falk, L. K. L.; Campbell, E. E. B. In Chem. Phys. Lett., 2000; Vol. 328, pp 369–373; Fan, S.; Liang, W.; Dang, H.; Franklin, N.; Tombler, T.; Chapline, M.; Dai, H. Physica E (Amsterdam), 2000; Vol. 8, pp 179–183; Wang, Q. H.; Setlur, A. A.; Lauerhaas, J. M.; Dai, J. Y.; Seelig, E. W.; Chang, R. P. H. In Appl. Phys. Lett., 1998; Vol. 72, pp 2912–2913.

Carbon nanotubes are structures that consist of a sheet of carbon atoms in graphene form wrapped into a cylinder. A single walled nanotube (SWNT) has only a single atomic layer of carbon atoms whereas multiwalled nanotubes (MWNT) may comprise of up to a thousand cylindrical graphene layers. MWNTs have excellent strength, small diameter (typically less than 200 nm) and near-metallic electrical conductivity, making them useful as an additive to enhance structural properties of composites such as carbon-carbon, carbon-epoxy, carbon-metal, carbon-plastic, carbon-polymer and carbon-concrete.

The physical, electrical and chemical properties of carbon nanostructures strongly depend on the size and topology of the nanotubes as well as the uniformity of these dimensions. Alignment of the carbon nanotubes is particularly important for their use in many applications, such as flat panel displays.

There exists a need for a more robust method of producing a wide variety of uniform carbon nanostructured materials economically.

There is a need for a nanostructure material having a high surface area layer containing uniform pores with a high effective surface area, and thus increasing the number of potential chemical reaction or catalysis sites on the nanostructure, which may also be functionalized to enhance chemical activity.

There is a further need to provide a composition of matter comprising a nanofiber having an activated high surface area layer containing additional pores and additional functionality which increase the effective surface area of the nanofiber and increase the number of potential chemical reaction or catalysis sites on the nanofiber, which is functionalized to enhance chemical activity wherein the additional functionality comprises a transition metal. Such a material has just been discussed in WO 02/16680 but that material does not teach how to control the diameter of the pores within nanofibers nor the surface area of the carbon nanostructured materials.

A still a further need is to provide a composition of matter comprising a nanofiber or nanostructured material comprising a carbide. A further need is a free standing carbon based article with uniformly distributed porosity. Of particular interest would be materials with nanopores of predeterminable diameters.

In addition, unless otherwise indicated, all numbers expressing quantities of ingredients, compositions, time, temperatures, distances and so forth used in the present specification and claims are to be understood as being modified in all instances by the term "about." Accordingly, unless indicated to the contrary, the numerical parameters set forth in the following specification and claims are approximations that may vary depending upon the desired properties sought to be obtained by the method of the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as practical. Any numerical value, however, may inherently contain certain errors necessarily resulting from the standard deviation found in their respective testing measurements.

The reader will appreciate the details and advantages of the present invention, as well as others, upon consideration of the following description of embodiments of the invention. The reader also may comprehend such additional details and advantages of the present invention upon performing the method and using the nanostructured materials of the present invention.

BRIEF DESCRIPTION OF THE FIGURES

The features and advantages of the present invention may be better understood by reference to the accompanying figures in which:

FIG. 7A is a field emission SEM image of a nanostructured material produced by the method of the present invention comprising pyrolyzing a precursor comprising a phase separated copolymer of the formula $(AN)_{45}$-$(BA)_{530}$-$(AN)_{45}$ indicating that the spherical morphology of the phase separated copolymer is retained in the nanostructured material;

FIG. 7B is a field emission SEM image of a nanostructured material produced by the method of the present invention comprising pyrolyzing a precursor comprising a phase separated copolymer of the formula $(AN)_{115}$-$(BA)_{295}$ indicating that the cylindrical morphology of the phase separated copolymer is converted to filaments in the nanostructured material;

FIG. 7C is a field emission SEM image of a nanostructured material produced by the method of the present invention comprising pyrolyzing a precursor comprising a phase separated copolymer of the formula $(AN)_{150}$-$(BA)_{150}$ indicating that the lamellae morphology of the phase separated copolymer is substantially retained in the nanostructured material;

FIG. 18A is the atomic force microscopy image of nanostructured material prepared in Example 6A imaged with a standard silicon probe (nominal spring constant 50 N/m) in tapping mode, FIG. 18B is the atomic force microscopy image of the same region of the nanostructured material prepared in Example 6A imaged after the tip purposefully blunted by crashing the standard silicon tip into the surface of the nanostructured material prepared in Example 6A; FIG. 18C is the atomic force microscopy image of same area of nanostructured material prepared in Example 6A after the tip prepared in FIG. 18B was withdrawn and reengaged in contact mode, FIG. 18D is a field-emission SEM image of the AFM tip comprising a carbon nanostructured material;

DESCRIPTION OF THE INVENTION

Figure 1:
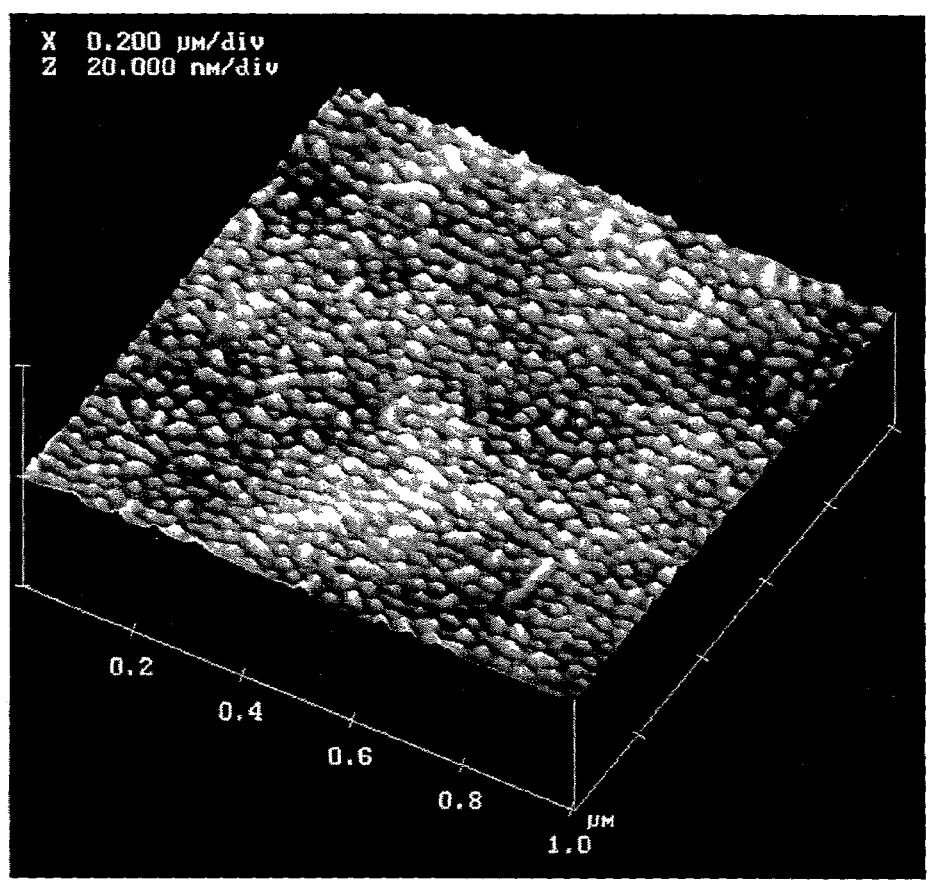
FIG. 1 is a atomic force microscopy image of a cast film of a precursor comprising a $(AN)_{379}$-$(BA)_{527}$-$(AN)_{379}$ polymer showing the regular arrays of the precursor phase comprising the PAN blocks of the phase separated copolymer.

The method of the present invention provides a novel and flexible method for the preparation of carbon nanostructured materials. An embodiment of the method of the present invention comprises the preparation of nanostructured materials by pyrolyzing a precursor. As used herein, a precursor is a material or mixture of materials which upon heating or pyrolysis carbonize to produce carbon based structures. The precursor of the method of the present invention comprises a phase separated copolymer or stabilized blend of polymers. The phase separated copolymer or stabilized blend of polymers may comprise at least one precursor material and optionally at least one sacrificial material. The phase separated copolymer may comprise additional functionality to be incorporated in the nanostructured material upon pyrolysis of the precursor.

In one embodiment of the method of the present invention, the precursor comprises a phase separated copolymer which comprises a precursor material. The precursor material may be any material which upon heating or pyrolysis produces a carbon based structure, for example, a polymer containing a monomer unit derived from an acrylonitrile monomer, an acrylate or a cellulosic based carbon precursor. The precursor may also comprise solvents, dopants, additional precursor material and sacrificial material such as homopolymers to control or affect the structure or composition of the nanostructured material. Further, the precursor material may comprises a hybrid copolymer, or may be a copolymer comprising silicon containing monomer units which may be converted to silica, thereby providing for direct preparation of nanocomposite structures. It is believed that these hybrid copolymers yield "nanoreinforced" ceramic materials directly.

The phase separated copolymer separates on a molecular scale forming a morphology comprising at least one precursor phase and, optionally, a sacrificial phase due to the immiscibility of the polymer blocks. Phase separated copolymers are polymers which comprise polymeric blocks that are immiscible in each other at the molecular level due to entropy. The polymeric blocks of the phase separated copolymer are, however, covalently attached preventing phase separation on a macroscale, therefore the phase separation is limited to the nanoscale, typically forming phases from about 5 to about 100 nm om dimension. The precursor phase may form a well defined phase of primarily precursor material, wherein the precursor material comprises at least 10% of the material present by weight in the precursor phase. The precursor phase is the primary source of material for formation of the carbon nanostructures. The sacrificial phase is used primarily to influence the morphology, self assembly and distribution of the precursor phase. During pyrolysis, the precursor material carbonizes to form the nanostructured material. The sacrificial phase is pyrolyzed and substantially removed from the nanostructured material. In this embodiment, the nanostructured material produced from the method of the present invention comprises a carbon based nanostructured material. However, the phase separated copolymer can also be selected to undergo pyrolysis to form two different carbon based structures such as a pure carbon phase and a doped carbon phase wherein the phase topology of each carbon based phase is related to the phase separated topology of the precursors.

Embodiments of the method of the present invention are capable of preparing carbon nanostructured materials, including carbon nanotubes, carbon nanofibers, carbon nanocylinders, and arrays of carbon nanostructured materials, of predeterminable distribution, structure, morphology, composition, and functionality. The carbon nanostructured materials may be prepared on planar or curved surfaces or as free standing articles, as well as many other configurations which will become evident based on this disclosure of the present invention.

Embodiments of the method of the present invention for the preparation of nanostructured materials include the pyrolysis of a precursor comprising a phase separated copolymer. The phase separable copolymers may comprise linear block copolymers, AB block copolymers, ABA block copolymers, ABC block copolymers, multiblock copolymers, symmetrical and asymmetrical star block copolymers, blends of polymers, graft copolymers, multi branched, (hyper)branched or dendritic block copolymers and novel brush copolymers. The blocks of each of the polymers may comprise a homopolymer block, a statistical polymer block, a random copolymer block, a tapered copolymer block, or a gradient copolymer block, as well as other forms of block copolymers. Any copolymer topology that allows incompatible segments to be present in a copolymer to phase separate inherently or after annealing, either alone or in the presence of a solvent is a suitable precursor. Brush copolymers are a new class of materials and conditions for preparing such materials are disclosed in commonly assigned U.S. patent application Ser. Nos. 09/359,359, 09/534,827 and 10/034,908 and these materials can undergo intramolecular phase separation when each graft is a block copolymer but still comprise a homogeneous solution. The phase separated copolymer or any additional polymers or dopants in the precursor phase or the sacrificial phase may include polymers immobilized on surfaces or attached to particles, the polymers may comprise additional organic and inorganic substituents, including silicon, and functional groups which may result in the formation of carbides or catalysts in or on the nanostructured material.

In an embodiment of the method of the present invention, the phase separable copolymer comprises monomer units derived form acrylonitrile. The method of the present invention includes, for example, pyrolyzing a precursor material comprising a phase separated copolymer at least partially comprising monomer units derived from acrylonitrile. The acrylonitrile comprising segments may be modified to include functionality that may be transferred to the carbon nanostructure during carbonization or pyrolysis or provide further immiscibility in the other blocks of the copolymer. The preparation of the phase separable copolymer may comprise preparing a film of a polymer and warming the polymer so domains of precursor material and sacrificial material further self organize prior to carbonization.

Due to the phase separation of the copolymer on the nanoscale the phase separated copolymers self assemble on the molecular level into phase separated morphologies. For example, ABC block copolymers may self assemble into over 20 different complex phase separated morphologies. However, the three most typical morphologies adopted by binary systems include spherical, cylindrical and lamellar morphologies. Phase separated domains may also include gyroid morphologies, with two interpenetrating continuous phases. The morphologies are dependent on many factors, including, but not limited to, the volume ratio of the segments, the chemical composition of the segments, their connectivity, the Flory-Huggins interaction parameters between the segments and processing conditions. The nanoscale morphologies formed by spontaneous or induced self-assembly of segmented copolymers typically exist below a certain critical temperature, (order-disorder temperature). The morphologies may be reversibly formed and polymers processed by conventional techniques such as injection molding, extrusion, film casting, solution casting, as well as other means.

The copolymers of the present invention may phase separate in bulk, in the presence of phase selective solvents, in solution, at interfaces, during fabrication or after annealing at an elevated temperature into more well-defined, self-organized, biphasic nanostructures including, but not limited to, spherical, non spherical, lamellar, gyroid, and cylindrical structures. Compositional and dimensional control over the copolymer precursor results in control over molecular topology, morphology and functionality of the phase separated material. These phase separated materials may provide a nanoscale constrained environment for specific applications, such as, crystal growth, or formation of stimuli responsive materials. These phase separated materials may comprise carbon precursors and therefore be suitable for formation of carbon comprising materials after carbonization, or pyrolysis. The dimensions, composition and topology of the resulting carbon nanostructure, including the distributions of nanostructures formed on a surface may be controlled by controlling the dimensions, composition and topology and molecular weight of each polymer segment of the phase separated copolymer, an other constituents. Therefore, well defined uniform precursors or mixtures of well defined uniform precursors are the preferred feedstock for the method of the present invention.

When this phase separated polymer morphology is designed to comprise cylindrical domains this procedure additionally allows for the direct formation of nanotubes, nanowire grids or arrays of oriented nanostructures on surfaces. Further, the method may be conducted on a film in contact with a surface to allow for the direct formation of an array of oriented nanostructures on the surface. The carbon nanostructures can be selected to be perpendicular or horizontally aligned on the surface as well as other orientations. The thickness of the film influences the length of the cylinders of the precursor when the nanostructured are perpendicularly orientated to the surface. The conditions of deposition and annealing may affect the length of the nanostructures when orientated parallel to the surface. A further means of depositing carbon nanostructured parallel to the surface is to spin or extrude a precursor polymer onto the surface prior to carbonization. Such arrays, after pyrolysis, could find application in nano-electronics including production of memory devices and nanowires in new generations of computers.

Embodiments of the present invention therefore relates to a high yield method for forming carbon nanostructures, which also may comprise nanotubes, nanofibers, nanowires, continuous carbon structures with nanoscale porosity or other carbon comprising nanostructures, by carbonization, or pyrolysis, of phase separated polymers and, further to the direct formation of an ordered array of such carbon based nanostructures on surfaces or an ordered array of porosity within articles.

In one embodiment, the method of the present invention comprises a robust and inexpensive method for manufacturing uniformly spaced (few tens of nm) and sized (nanometers to tens of nanometers) carbon based nanoclusters or nanofibers by pyolysis of ultra-thin films, thin films or thick films.

While pyrolysis of polyacrylonitrile has been employed for decades for the preparation of carbon fibers, it might appear unlikely that the "soft" nanoscale morphology of phase separated copolymer precursors would withstand thermal treatment at temperatures well above the block copolymers order/disorder temperature. However, the nanoscale morphology of the phase separated copolymer precursor can be "fixed" or stabilized by chemical crosslinking of the phase separated copolymer. The preparation of the phase separated copolymer precursor may therefore comprises preparing a film of a copolymer and warming the copolymer so domains of precursor polymer and sacrificial polymer self organize and thereafter are stabilizing the domains prior to carbonization. This ability to stabilize the phase separated morphology of phase separated copolymers and retaining the ability to conduct pyrolysis of the precursor phase while sacrificing a second phase allows for the tuning of the structural and electronic properties of the resulting carbon based materials by forming well defined nanoscale Tr clusters.

This ability to control the size and distribution of carbon nanostructures by manipulation of the composition and fabrication conditions of block copolymers may find utility in the preparation of defined nanoscale Tr clusters for conducting and semiconducting applications. To be semiconducting, the Tr cluster needs to be nanometer in size and have diameters in the range of just a few nanometers, carbon nanotubes are good examples of Tr clusters of this size. In contrast to prior art, the challenges associated with control of the nanostructure of Tr clusters are addressed in the approach disclosed through preorganization of the carbon precursor at the nanoscale. This capability can easily be combined with lithographic techniques thus opening the way for device fabrication that until this time has remained a challenge for carbon nanotubes.

The self organized, phase separated copolymer morphologies of the precursor strongly influence the morphology of the ultimate carbon nanostructured material. Control over the copolymer composition, polymer physical dimensions and fabrication conditions results in control over intra-phase and long range order in the phase separated copolymer precursor which may directly correlate to control over the structure, topology, distribution and functionality of the ultimate nanostructured materials or the structure, topology and distribution of nanopores in the nanostructured materials with a continuous carbon phase.

Embodiments of the present invention are directed towards the preparation and composition of nanostructured materials comprising structures with controlled topology, morphology and functionality. The precursor may further comprise functional groups. The functional groups may be terminal functional groups or may be distributed anywhere along the length of the phase separated copolymer. Brush copolymers, of controlled topology, such as those disclosed in commonly assigned U.S. patent application Ser. Nos. 09/359,359 and 09/534,827, which may comprise carbonizable or pyrolizable monomer units in at least one graft segment or in the backbone, offer a route to prepare carbon nanotubes, carbon nanowires, nanocylinders or nano-composite structures with a nano-, meso- or macro-pore of predeterminable size within the structure.

Suitable polymeric materials are preferably prepared by controlled polymerization processes because among other advantages, they yield more compositionally uniform and purer products that undergo a more uniform phase separation due to uniform segment or block length. However, polymers from other processes may be suitable precursors for the production of carbon nanostructures for certain applications, for example, materials prepared by anionic polymerization processes can be used as macroinitiators or macromonomers in a controlled radical polymerization process for the preparation of phase separable copolymer precursors. For purposes of this invention, a precursor may comprises a synthetic resin in the form of a solution or low viscosity liquid at ambient temperatures or a bulk (co) polymer capable of being liquefied by heating or other means is especially useful. Solid resins can be used as the foundation for shaping precursors to form activated carbon structures or carbide structures.

With the discovery of controlled radical polymerization processes including ATRP described in commonly assigned U.S. Pat. Nos. 5,763,546; 5,807,937; 5,789,487; 5,945,491; 6,111,022; 6,121,371; 6,124,411; and U.S. patent application Ser. Nos. 09/034,187; 09/018,554; 09/431,871; 09/359,359; 09/359,591; 09/369,157; and 09/534,827 all of which are herein incorporated by reference and other controlled radical polymerization processes described in published papers and cited in *Controlled Radical Polymerization;* American Chemical Society: Washington, D.C., 1998, Vol. 685, Matyjaszewski, K., Ed., it is possible to prepare well defined block copolymers; Patten, T. E.; Matyjaszewski, K. *Adv. Mater.* 1998, 10, 901; comprising free radically (co) polymerizable monomers such as acrylonitrile; Jo, S. M.; Gaynor, S. G.; Matyjaszewski, K. *Polym. Prep. (Am. Chem. Soc., Polym. Div.)* 1996, 37(2), 272.

Figure 2:
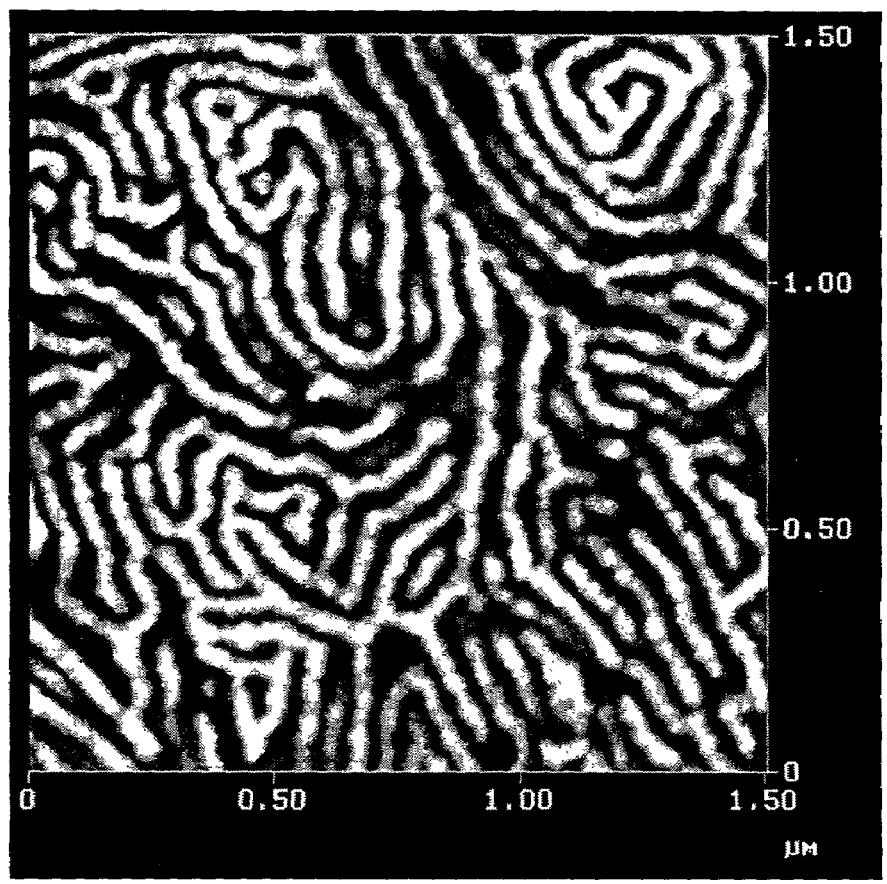
FIG. 2 is the image showing of the morphology of a phase separated PAN-b-PBA copolymer.

Copolymers comprising blocks comprising polyacrylonitrile (PAN) and blocks comprising another monomer may be constructed wherein the copolymer phase separates and, under the appropriate conditions, such as, for example, the appropriate ratio of block lengths, the PAN phase forms domains organized into regular arrays as shown in AFM FIGS. 1 and 2, for example. These figures exemplify only one of the many morphologies that can be created from properly designed phase separable copolymers. The morphology, form and structure, of the phase separated PAN domains depends upon many factors, including, but not limited to, the length of each polymer block, the molar ratio of the acrylonitrile units to the comonomer units, the type and structure of copolymer precursor, the chemical compatibility of the polymer segments, the presence of solvents, homopolymers, dopants, etc. Solvents may assist in phase separation and in defining the self organized domain structures attained in the final material due to selective solvation of one or more of the phases and in bulk materials, the process employed in fabricating the article. The dimensions of the PAN phase domains may be strongly controlled by the molecular weight and ratio of blocks of the copolymer. The level of control attained over the synthesis of copolymer precursors may be through controlled polymerization of precursor monomers such as acrylonitrile allows atomic-level macromolecular engineering to be conducted and hence preparation of well defined copolymer macromolecules which undergo phase separation with preselected phase topology serving as precursors that undergo self-assembly for preparation of carbon nanostructures.

In certain embodiments, a block (co)polymer comprising a precursor material may be preferred over random or gradient copolymers since block (co)polymers may, typically, more readily form phase separated morphologies which can self organize in a discontinuous structure or in a continuous uninterrupted structure of three dimensions. However, phase separable copolymer precursors with random copolymer segments may also be employed and with proper selection of the segment distribution and may lead to carbon nanostructures with high surface area. Furthermore, since a stabilized blend comprising homopolymers can also self assemble into phase separated structures such stabilized blends therefore may also be utilized in the method of the present invention.

The phase separable copolymer may also comprise gradient copolymer segments or blocks that can be used to selectively introduce functionality into the core or onto the surface of the final formed carbon nanostructured or can even be used to introduce increased surface area into the final carbon structure. Gradient copolymers, including gradient brush copolymers, can also be employed to tailor the shape the resulting carbon nanostructure. We have disclosed earlier procedures for the preparation of brush block copolymers which may be prepared, for example, from a controlled polymerization comprising a macroinitiator with many initiation sites. A brush copolymer is prepared from a copolymer backbone, having a gradient of initiation sites the resulting brush polymer has a tapered shape. Such a molecule would form a shaped nanostructure after pyrolysis. RAFT polymerization procedures may be used to prepare very high molecular weight macroinitiators for the production of graft or brush copolymers. The resulting individual macroinitiator may be over 7,000 Å long, which is long enough to be a precursor for a carbon based nanowire.

The simplest phase separable block copolymers are AB and ABA block copolymers, or graft copolymers. The invention is first exemplified by a non-limiting discussion of polyacrylonitrile-block-acrylate and polyacrylonitrile-block-acrylate-block-polyacrylonitrile copolymers. Such copolymers may be prepared by controlled polymerization processes including, but not limited to, Atom Transfer Radical Polymerization (ATRP) as described in commonly assigned U.S. Pat. Nos. 5,763,546; 5,807,937; 5,789,487; 5,945,491; 6,111,022; 6,121,371; 6,124,411 and U.S. patent application Ser. Nos. 09/034,187; 09/018,554; 09/431,871; 09/359,359; 09/359,591; 09/369,157; 09/534,827; 06/238,809; 06/238,810; 06/238,811; and 06/238,812 with Matyjaszewski as one of the inventors, RAFT and NMP.

Figure 4:
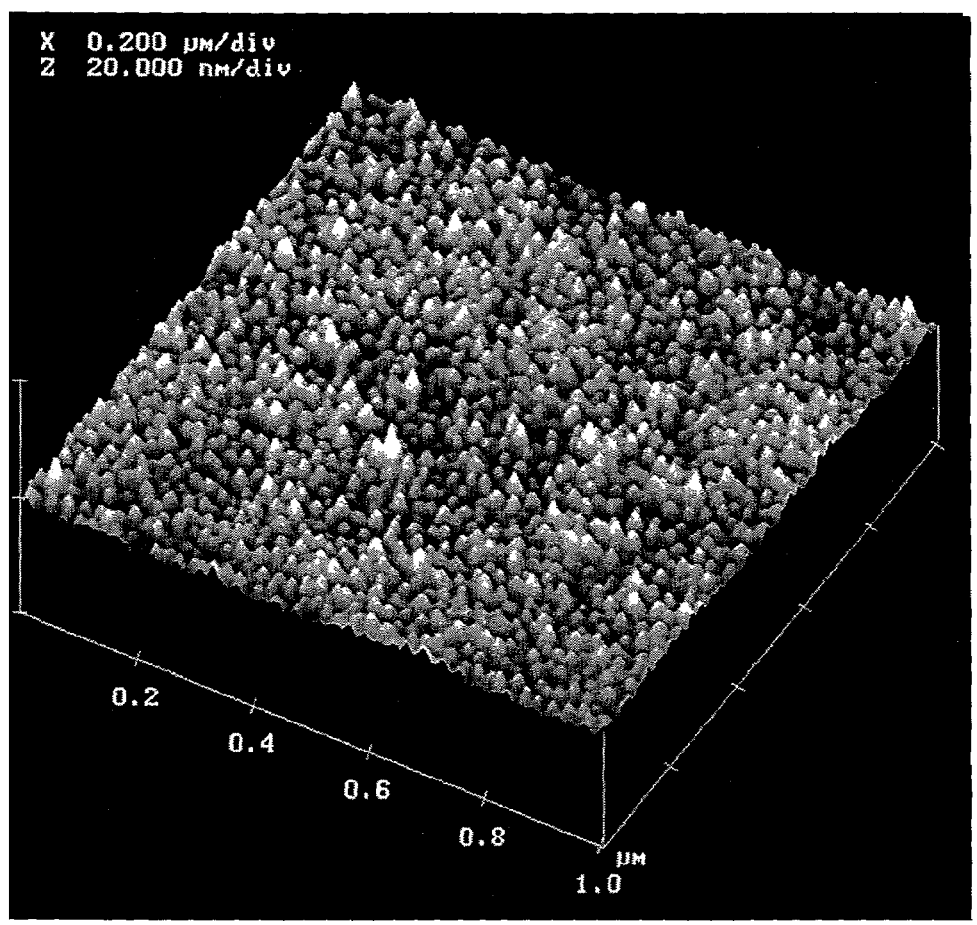
FIG. 4 is a atomic force microscopy image of a cast film of the precursor comprising a $(AN)_{379}$-$(BA)_{527}$-$(AN)_{379}$ polymer showing the more well defined regular arrays of the precursor phase after the annealed cast film of FIG. 3 has been stabilized by heating in air to 220° C.
Figure 5:
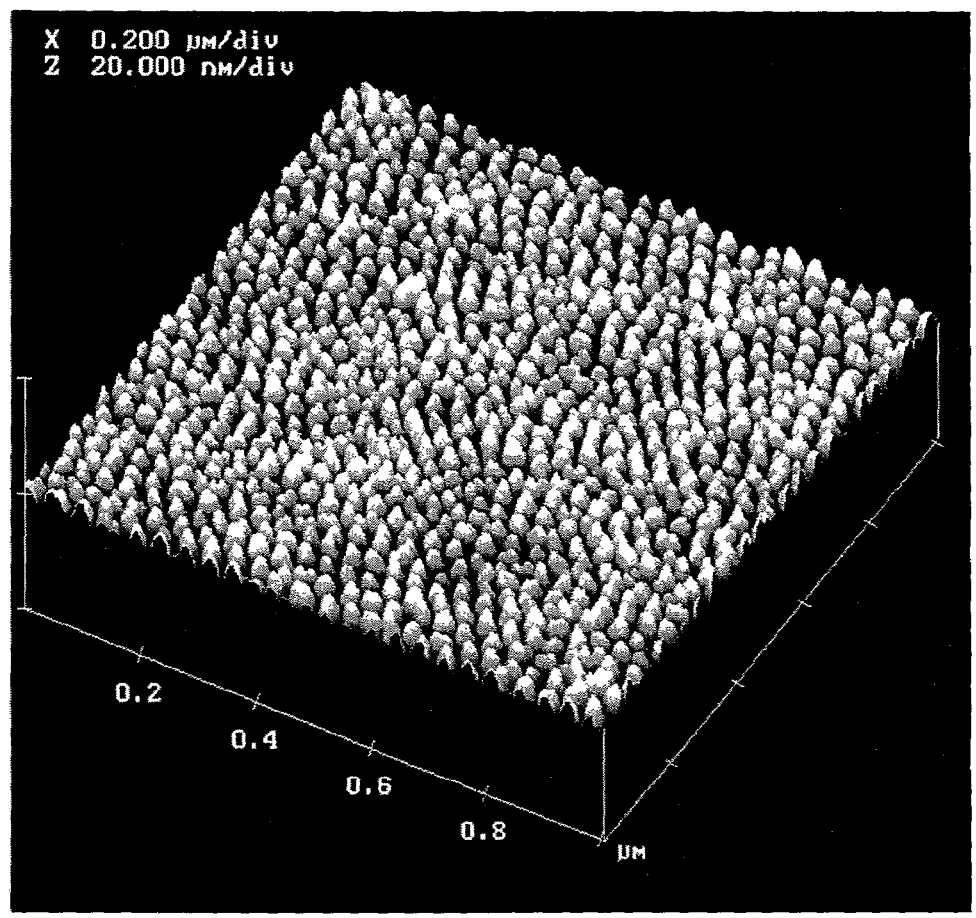
FIG. 5 is a atomic force microscopy image of a cast film of the precursor comprising a $(AN)_{379}$-$(BA)_{527}$-$(AN)_{379}$ polymer showing the more well defined regular arrays of the precursor phase after the cast film of FIG. 4 has been heated to 600° C. under nitrogen atmosphere.
Figure 6:
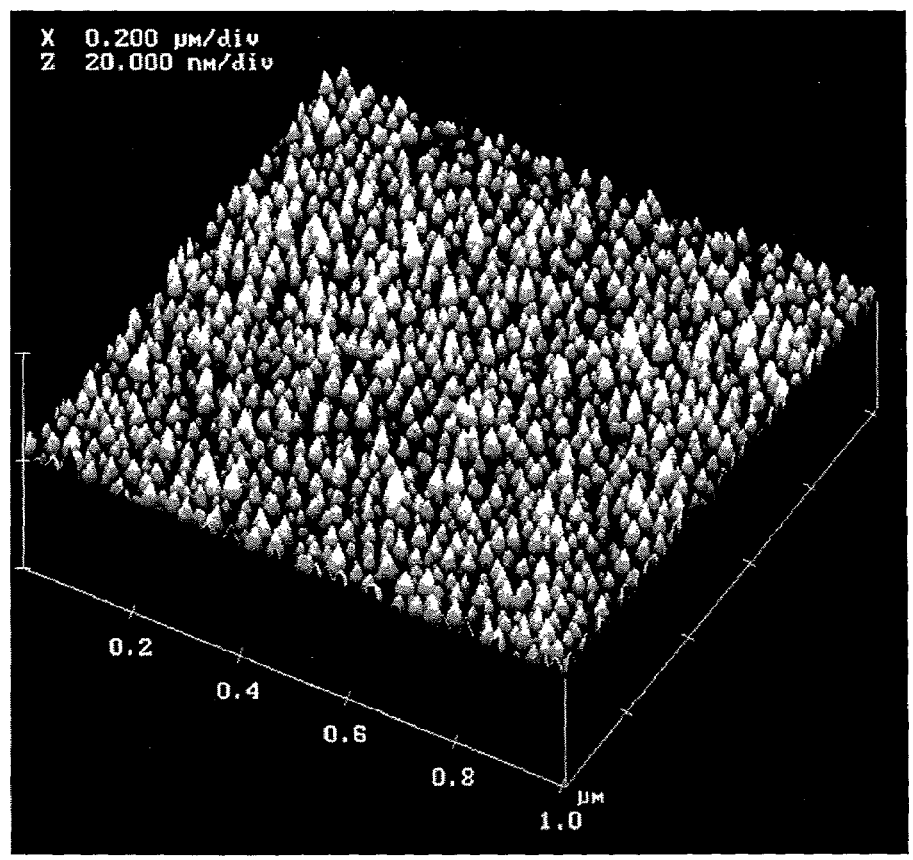
FIG. 6 is an atomic force microscopy image of a cast film of the precursor comprising a $(AN)_{379}$-$(BA)_{527}$-$(AN)_{379}$ polymer showing the more well defined regular arrays of the precursor phase after the cast film of FIG. 5 has been heated to 1200° C. under nitrogen atmosphere.

The first detailed example of the present invention describes an ABA block copolymer [$(PAN)_{45}$-$(BA)_{530}$-$(PAN)_{45}$, based on NMR anaylsis] which may be cast into a film from a solvent and forms a phase separated structure with substantially cylindrical domains of polyacrylonitrile, the precursor phase on a substrate, see FIG. 1. The cylindrical PAN domains are surrounded by the continuous sacrificial phase which may be removed during the carbonization or pyrolysis. The phase separated copolymer precursor was subjected to annealing at 200–230° C. to prepared more well defined domains, see FIG. 3. Pyrolysis and carbonization of this film provides an array of carbon fibers oriented perpendicular to the surface of the substrate, see FIGS. 4 through 6.

As expected thin or ultra-thin films of phase separated copolymer precursors exhibited nanoscale morphologies such as spheres and short cylinders being formed from a triblock $(PAN)_{45}$-$(BA)_{530}$-$(PAN)_{45}$, see FIG. 7A, long cylinders for a diblock $(PAN)_{115}$-$(BA)_{150}$, see FIG. 7B, and lamellae for $(PAN)_{150}$-$(BA)_{150}$, see FIG. 7C. As determined by AFM, the average center-to-center spacing for circular domains in $(PAN)_{45}$-$(PBA)_{530}$-$(PAN)_{45}$, the average cylinder width in $(PAN)_{115}$-$(PBA)_{295}$, and the average lamellar spacing in $(PAN)_{150}$-$(PBA)_{150}$ were in the range of 30–40 nm. The spacing may be increased by increasing the degree of polymerization of the butyl acrylate block or decreased by preparing a block copolymer with a butyl acrylate block with a lower degree of polymerization.

The relative domain sizes of the precursor phase and the sacrificial phase in the phase separated block copolymer depends on the molecular weight and composition of the blocks in the block copolymer, and the mole ratio of the blocks or may be further adjusted by dilution of one or both phases with a compatible polymer, preferably of similar molecular weight or similar molecular weight to a block, a dopant, oligomers, monomer or other solvent. Suitable solvents for the formation of the precursor film include THF, ethylene carbonate, and DMF. Mixtures of these solvents with other solvents such as aliphatic alcohols are suitable for making micellular solutions, from which, after drying the organized micellular precursors for carbon nanostructure-based materials can be obtained. Additionally, the domains size and morphology may be adjusted by incorporating additional monomers or other dopants into at least one of the sacrificial phase or the precursor phase to affect the immissibility of the phases of the copolymer.

Figure 8:
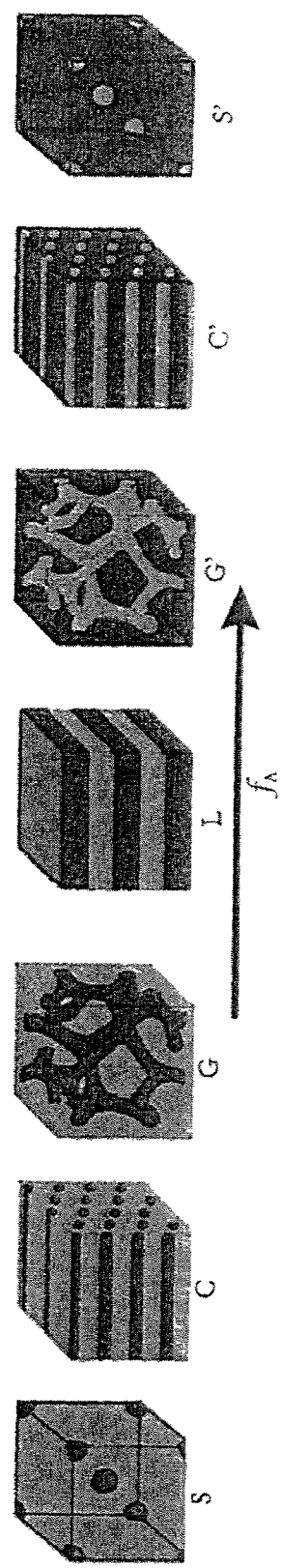
FIG. 8 is a schematic of exemplary morphologies of a precursor of the present invention comprising biphasic phase separated copolymers wherein each morphology has a different ratio of carbon nanostructure precursor phase and sacrificial phase.
Figure 9:
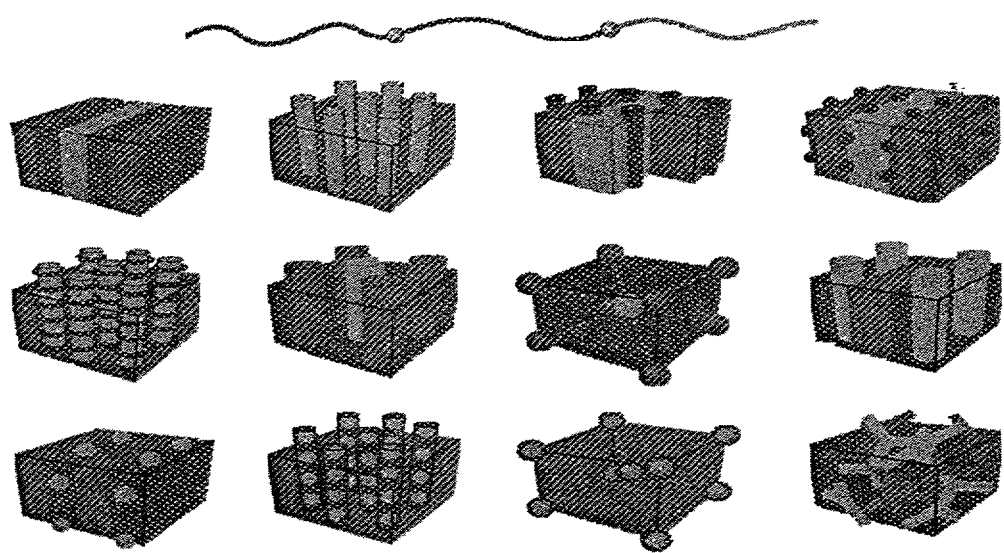
FIG. 9 is a schematic of exemplary morphologies of a precursor of the present invention comprising triphasic phase separated copolymers wherein each morphology has a different ratio of precursor phase, sacrificial phase, and third phase.

Many different polymeric structures may be used in the method of the present invention to produce unique carbon nanostructures. If we consider only one potential carbon precursor, polyacrylonitrile (PAN) then the final morphologies of the carbon materials depend on the weight ratios of PAN segments to the sacrificial segments but are also defined by the molecular structure of each macromolecule. [Milner, S. T. *Macromolecules* 1994, 27, 2333–2335] Therefore a systematic variation of these structures can develop full structure-property relationship. Thus, block copolymers with phase separated morphology may be prepared with variations as follows:

a) control of the mole ratio of the precursor phase to the sacrificial phase will lead to the formation of various morphologies in the nanophase separated systems, such as, but not limited to, those exemplified in FIG. 8, spheres (S and S' in FIG. 8), cylinders (C and C' in FIG. 8), lamellae (L and L' in FIG. 8) and gyroid structures, (G and G' in FIG. 8). The carbon precursor material may be in the sphere, cylinder or other structure or in the surrounding phase. This may be accomplished, for example, by increasing the proportion of PAN in the segmented copolymer from 20 to 80% as graphically represented in FIG. 8. It is also possible to form bi-continuous phases especially with star-like block architectures. Copolymers comprising larger proportion of PAN may require use of reversible addition fragmentation transfer (RAFT) rather than ATRP as the preferred controlled radical polymerization procedure.

b) control of the absolute size of the sacrificial and precursor blocks. The size of the PAN domains and ultimately the carbon nanostructure, may be changed by increasing the molecular weight of each PAN segment, for example from $M_n$=10,000 to 100,000. The spacing of the carbon nanostructures may be controlled by changing the size of PBA domains by changing from, for example, the PBA molecular weight may be increased from $M_n$ of 50,000 to 300,000. The dimensions of the individual domains may be affected by blending the block copolymers with one or more homopolymers, although some aggregation of the domains may be more difficult to avoid unless a compatible polymer, or the same polymer of similar molecular weight is used. Therefore, homopolymers may comprise monomer units similar to the monomer units of the polymer precursor or they may be different.

c) chain architectures by using AB, ABA, $(AB)_n$ linear multiblock and $(AB)_n$ multiarm stars block copolymers may be used to form differing phase separated morphologies. ABC triblocks should lead to a much larger range of morphologies, as already reported in literature, and exemplified in FIG. 9.

Triphasic polymeric materials may self organize into several morphologies with separate discrete phases that lend themselves after pyrolysis to the formation of carbon nanostructures with discrete catalyst phases. In one embodiment, a catalyst precursor structure may be prepared from a phase separated polymer precursor having the phase separated structure on the left of the center row of FIG. 9. The copolymer segments are selected such that the carbon precursor phase is a continuous phase and catalyst precursor phase is a dispersed discontinuous phase, after carbonization the resulting continuous carbon structure would possess pores of substantially uniform diameter and regularly distributed along these pores would be a catalyst formed from the distributed catalyst precursor phase seen in FIG. 9. In one embodiment, such a useful material can be constructed from an ABC block copolymer with the A or C block comprising the precursor for the carbon nanostructured and the B block comprising a functional monomer that possesses as a substituant another element that can act as a catalyst site after pyrolysis. Other polymer structures may be structures suitable for preparation of carbon structures displaying catalytic properties such as polymers comprising random copolymer blocks incorporating precursors of elements that display catalytic properties.

Such materials can be prepared from PAN (co)polymers with greater than 30% PAN that form a continuous PAN matrix with dispersed phase of a material than is lost during pyrolysis forming pores of known structure throughout the resulting carbon based structure. The structure of the carbon matrix and the size and shape of the pores are determined, at least partially, by the % PAN in the precursor copolymer and the composition of the sacrificial phase and the conditions employed for fabrication of the structure and conditions for annealing the formed structure and "setting" or consolidating the morphology of the PAN phase; as described below.

These morphologies may be preserved at the elevated temperatures needed for crosslinking PAN and stabilizing these microphases. Therefore strongly incompatible systems such as polystyrene, polyacrylates or polysiloxanes may be used as the additional blocks. The self assembling phase separated morphologies may be stabilized by crosslinking the PAN monomer units.

Figure 11A:
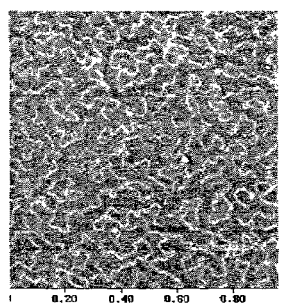
FIG. 11A and FIG. 11B are photographs of microscopic images of brush copolymers.
Figure 11B:
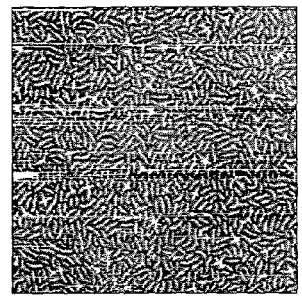
Figure 11C:
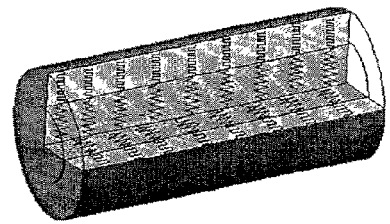
FIG. 11C is a diagrammatic representation of a brush copolymer comprising block copolymer grafts.

Some phase morphologies may be inherent in the molecular structure of the polymer, for example, long densely grafted molecular brushes based on homo and block copolymers. [Boerner, H. G.; Beers, K.; Matyjaszewski, K.; Sheiko, S. S.; Moeller, M. *Macromolecules* 2001, 34, 4375–4383; Sheiko, S. S.; Prokhorova, S. A.; Beers, K. L. Matyjaszewski, K.; Potemkin, I. I.; Khokhlov, A. R.; Moeller, M. *Macromolecules* 2001, 34, 8354–8360] These molecular brushes form elongated structures which can self assemble in regular patterns. These structures may reversibly rearrange. Some brushes may be as long as 1 micron. An embodiment of the present invention comprises molecular brush copolymers as phase separated polymer precursors. The grafts may be copolymers comprising the PAN on the inside segment attached to the backbone on the outside attached to the sacrificial block. PAN segments on the inside may form an array of nano-wires while PAN blocks on the outside may form hollow cylinders with nano- or meso-scale internal channels after degradation of the sacrificial phase. These materials may have many unusual properties and could be efficient as membranes for molecular filtering, for example. Images of such brush copolymers are shown in FIGS. 11A, 11B and a schematic representation of a brush containing attached block copolymer segments are shown below in FIG. 11C. In one image, FIG. 11B, the length of the brush is short and in the other image, FIG. 11A, the length of the brush is long. Brushes with backbone chain lengths in excess of 3500 monomer units have been prepared by controlled radical polymerization procedures and such a polymer when chain extended by presence of the multiplicity of grafted side chains can extend for lengths greater than 1 μm. The length of the image in FIG. 11A is one micron and the length of the image of FIG. 11B is 3 microns.

Figure 10:
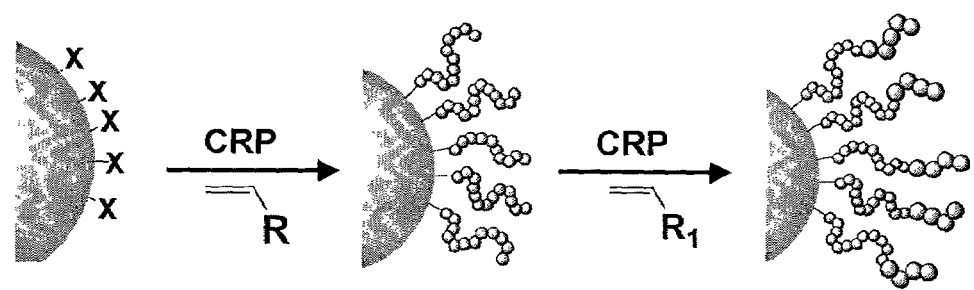
FIG. 10 is a schematic representation of the process for the preparation of block copolymers tethered to a particle.

The morphology of these intramolecularly phase separated structures can be stabilized and converted into a continuous precursor structure by reaction of chain end functionality at the surface of each brush to provide brush-brush interactions thereby providing a precursor material which can provide for a continuous carbon based structure with cylindrical pores of preselected dimensions.

d) control of composition by choice of comonomers. Monomers other than acrylonitrile may be incorporated, such as, various acrylates, methacrylates, styrenes, monomers containing B, P, Si, As, and other elements, or groups if, for example, functional materials are desired. The functionality may be incorporated as substituents in styrene or (meth)acrylates based monomers, for example. These special comonomers, typically, from <(1 mol % to 5 mol %) can be randomly copolymerized with AN to give uniform incorporation of the functional monomer, or selectively copolymerized to form a gradient copolymer. In one embodiment, the pyrolysis of phase separated copolymer precursors comprising functional groups may result in spontaneous in situ doping of the resulting carbon phases. This doping can be uniform throughout the carbon based structure or form a gradient or other irregular distribution of doped species concentrated on the inside or outside of the resulting nanostructure.

e) Grafting can also performed from surfaces, including a thin film of copolymer from flat silicon wafers silica particles or silsesquioxane particles, including nanoparticles by using attached initiators of variable densities. For example, PAN and PAN-PBA block copolymers may be also grown from silica and silsesquioxanes nanoparticles, as recently demonstrated for styrene and acrylates [Matyjaszewski, K. *Macromolecules* 1999, 32, 8716–8724; Pyun, J.; Matyjaszewski, K.; Kowalewski, T.; Savin, D.; Patterson, G.; Kickelbick, G.; Heusing, N. *J. Am. Chem. Soc.* 2001, 123, 9445–9446; Pyun, J.; Matyjaszewski, K. *Chem. Mater.* 2001, 13, 3436–3448; Matyjaszewski, K.; Miller, P. J.; Kickelbick, G.; Nakagawa, Y.; Diamanti, S.; Pacis, C. *ACS Symp. Ser.* 2000, 729, 270–283] An example of a brush copolymer and the process of preparing a brush copolymer is shown schematically in FIG. 10. Polymerization and subsequent pyrolysis of the polymer precursor from silicon wafers enables formation of thin films of carbon nanostructured materials with a variable or preselected density (depending on distribution or pattern of initiating sites and polymer composition, as well as other factors), whereas polymerization and subsequent pyrolysis from particles provides carbon rich phase with entrapped silica/siloxane nanophase centers. These nanophases can be subsequently removed by treatment with HF vapors, forming monolithic carbon structures with holes, for example from 5 to 20 nm size or hollow carbon spheres if PAN is copolymerized from a sacrificial block attached to the particle.

Figure 12:
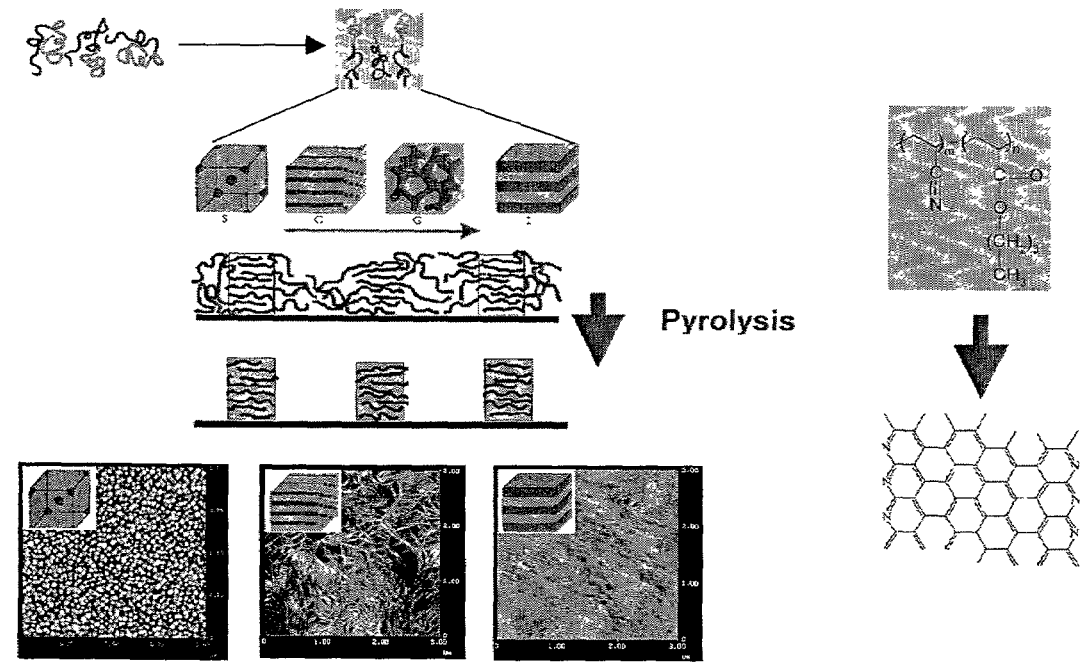
FIG. 12 is a graphical representation of an embodiment of the method of the present invention of the preparation of nanoporous electrodes for supercapacitors and nanostructured materials for photovoltaic cells based on networks of internal donor-acceptor heterojunctions.
Figure 12:
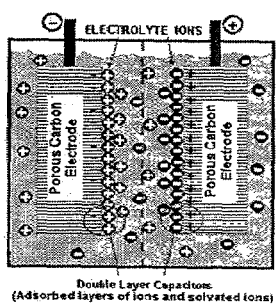
Figure 12:
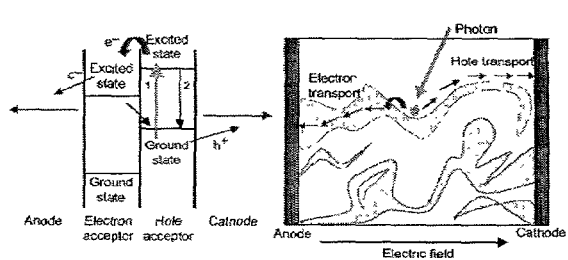

FIG. 12, provides a summary of some embodiments of the present invention, using block copolymers comprising polyacrylonitrile blocks which can self-assemble into a variety of nanostructures dictated by the relative mole ratio of both blocks. These self-assembled structures are then stabilized and then the polyacrylonitrile blocks are converted into carbon by pyrolysis retaining the nanostructure. These well defined nanostructured carbon based materials can find utility as nanoporous electrodes for supercapacitors or in energy storage/conversion devices such as nanostructured matrices for photovoltaic cells.

A factor determining the morphology of the phase separated copolymers is the chemical composition of the copolymer (immiscibility of segments characterized by the Flory-Huggins parameter $\chi$ and the length and weight fraction of constituent blocks). Numerous physicochemical factors provide opportunities to control the self-assembly. Through the use of selective solvents, self-assembly may be induced when the copolymer is still in solution. Block crystallizability may be also of importance with PAN copolymers, since, although PAN obtained by ATRP is atactic, PAN is an unusual polymer, which can partially crystallize even when atactic. In this application we primarily focus on exemplifying the utility of the method of the present invention by examining thick, thin, and ultra-thin film materials prepared by casting, spin-coating, solvent casting and dip-coating. Thin films of carbon based nanostructures have applications in electronic devices. Thin films of polymers provides vast opportunities for manipulation of self-assembly stemming from surface and confinement interactions with the surface or, which may be completed through the use of external fields, for example. Owing to potential nucleation and epitaxial effects, surface and interfacial interactions gain further importance in copolymers with crystallizable blocks, such as those which may be used in the method of the present invention. For example, orientation of PAN cylinders perpendicular to a substrate may lead through pyrolysis to "forests" of carbon nanotubules, this orientation is applicable in the area of field-emission cathodes for flat panel displays, and also attractive for applications in supercapacitors and photovoltaic cells including solar cells. Substrates may include silicon wafers with various types of doping and oxide layers of varying thickness, quartz glass, mica and highly-oriented pyrolytic graphite (HOPG) as well as other substrates. Silicon is, typically, the substrate chosen for electrical characterization and device development. Quartz glass has been used primarily for UV-Vis-NIR spectroscopy. Owing to their high $T_m/T_g$ values, both of these substrates are preferred for materials derived by pyrolysis.

Figure 13:
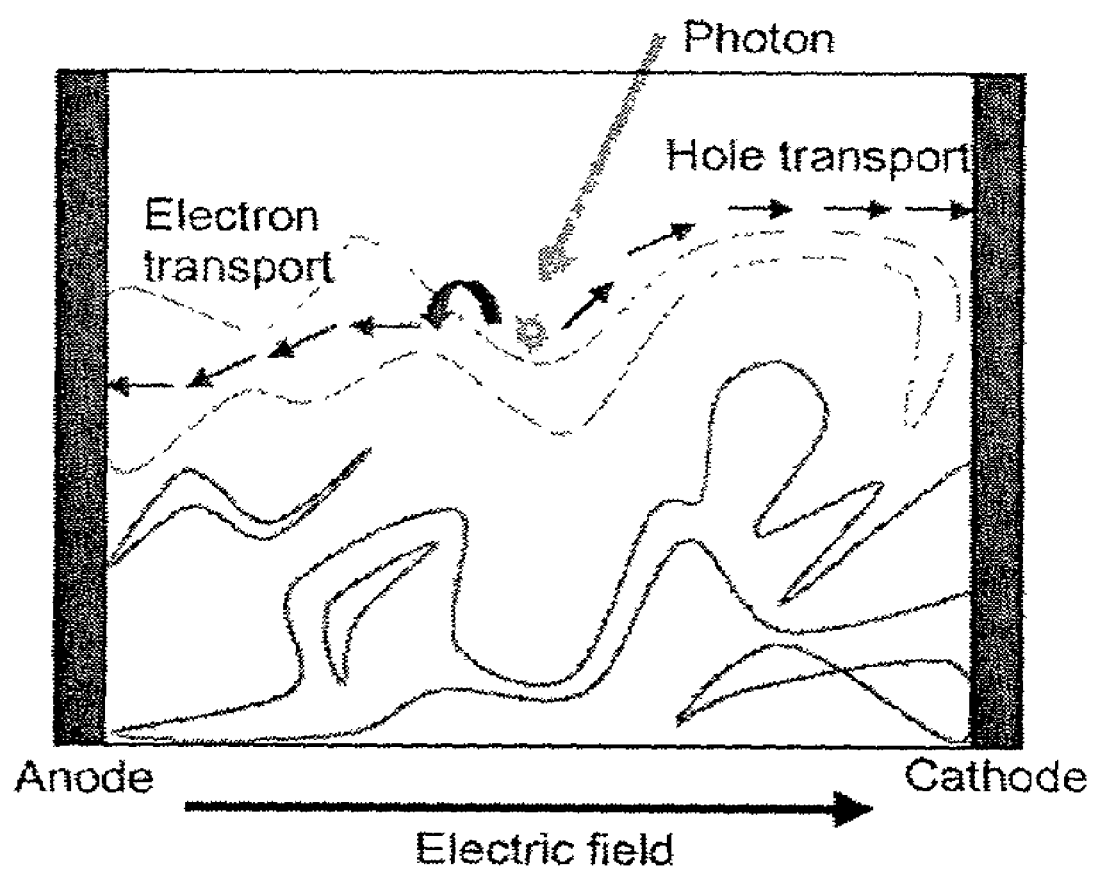
FIG. 13 is a graphical representation of the morphology of nanoscale networks of internal heterojunctions of photovoltaic cells comprising nanostructured materials prepared by the an embodiment of the method of the present invention.

As described above, FIG. 12 is a graphical representation of an embodiment of the method of the present invention of the preparation of nanoporous electrodes for supercapacitors and nanostructured materials for photovoltaic cells based on networks of internal donor-acceptor heterojunctions. Precursors comprising phase separated PAN copolymers, or another precursor comprising a phase separable copolymer, may self assemble into a variety of nanostructured morphologies dictated by the relative content of the blocks of the copolymer, as well as other factors described herein. The precursor is pyrolyzed into a highly graphitic carbon based nanostructured material. Carbon nanostructures formed by the pyrolysis of phase separated PAN copolymers are well suited for applications in energy storage and conversion devices. Nanoporous electrodes prepared by the method of the present invention are well suited for in capacitors and nanostructured matrices prepared from the method of the present invention based on networks of internal donor-acceptor heterojunctions are well suited for use in photovoltaic cells. FIG. 13 is a graphical representation of the morphology of nanoscale networks of internal heterojunctions of photovoltaic cells comprising nanostructured materials which may be prepared by the an embodiment of the method of the present invention.

The epitaxy of PAN crystals leads to long-range order of the copolymer domains. The graphoepitaxy effects also are advantageous for long range ordering of the copolymer domains. In contrast to epitaxy, which relies on structure templating by crystal lattices, graphoepitaxy templates structures by surface relief, which may be introduced by patterning, for example. Graphoepitaxy in block copolymer systems has been demonstrated recently by Kramer and coworkers. [Segalman, R. A.; Yokoyama, H.; Kramer, E. J. In *Adv. Mater. (Weinheim, Ger.)*, 2001; Vol. 13, pp 1152–1155.] In one embodiment, copolymers may be phase separated on use silicon surfaces with appropriate relief patterned lithographically.

With nanostructured carbon based materials obtained from precursors comprising PAN copolymers, physicochemical manipulation of nanostructure may result from the pyrolysis and resulting graphitization. Pyrolysis may be carried out in controlled-atmosphere tube furnaces. The pyrolysis of the present invention were performed in a DuPont thermogravimetric analysis system (TGA-951) equipped with a computer controller, with programable temperature ramps. Since pyrolysis may be associated with very substantial weight loss, thermogravimetry was utilized to measure the progress of the pyrolysis in a Rheometrics 1000 TGA system.

Synthesis of the polymer precursors, for instance ABA block copolymers, may be prepared by a controlled living polymerization processes such as ATRP, as well as other controlled radical polymerization processes including NMP and RAFT. The polymers may be prepared by any means, such as with monofunctional or difunctional initiators. For polymerizations with difunctional initiators, the terminal functional groups on the A-blocks may be converted into short non-compatible blocks, prior to casting the film, forming a CABAC block copolymer. Thereby providing a more readily oxidized core within the phase separated PAN phase domains. This allows for the preparation of carbon based nanostructures with mesopores of controllable dimensions. These "nanocylinders" are nano-sized structures comprising, a wall with a predeterminable thickness surrounding a pore and the individual structure may be part of an array wherein the nanocylinder is separated from its nearest neighbors by a predeterminable distance.

Embodiments of the present invention comprise the controlled carbonization, or pyrolysis, of a copolymer precursor with phase separated morphologies for the preparation of nanostructured materials. The dimensions of the formed nanoscale carbon based structures produced by the method of the present invention directly result from the dimensions and morphology of the precursor and on the conditions employed in consolidation and stabilization of the phase morphology and the pyrolysis. The nanostructured precursors can thereby be converted into highly graphitic nanostructured materials. By the method of the present invention, carbon nanotubes may be formed. In general, the shape and size of the nanotubes may be modified by changing composition of the copolymer precursor, the self assembling environment and the pyrolysis conditions.

In another embodiment, nanocylinders may be prepared by forming the A block before the B block using an oligomeric initiator and then use the polymers directly, as a modified CAB block copolymer, or couple the CAB block copolymer prior to use to form the CABAC (co)polymer. In this approach the more readily oxidized core, within the phase separated PAN domains, would comprise the residue of an initiator molecule.

Another embodiment comprises a solution of phase separable AB block copolymers which can form self assembled nanowire arrays under external stimulation. T. Thrum-Albrecht et. al.; Science 290 (5499) 2126, describe the stabilization of such arrays. Stabilized arrays comprise carbon precursors, such as the poly(butyl acrylate-b-acrylonitrile) AB block copolymers described below, shown in FIG. 15, may self assemble to form nanowire arrays comprising carbon precursors.

Figure 14:
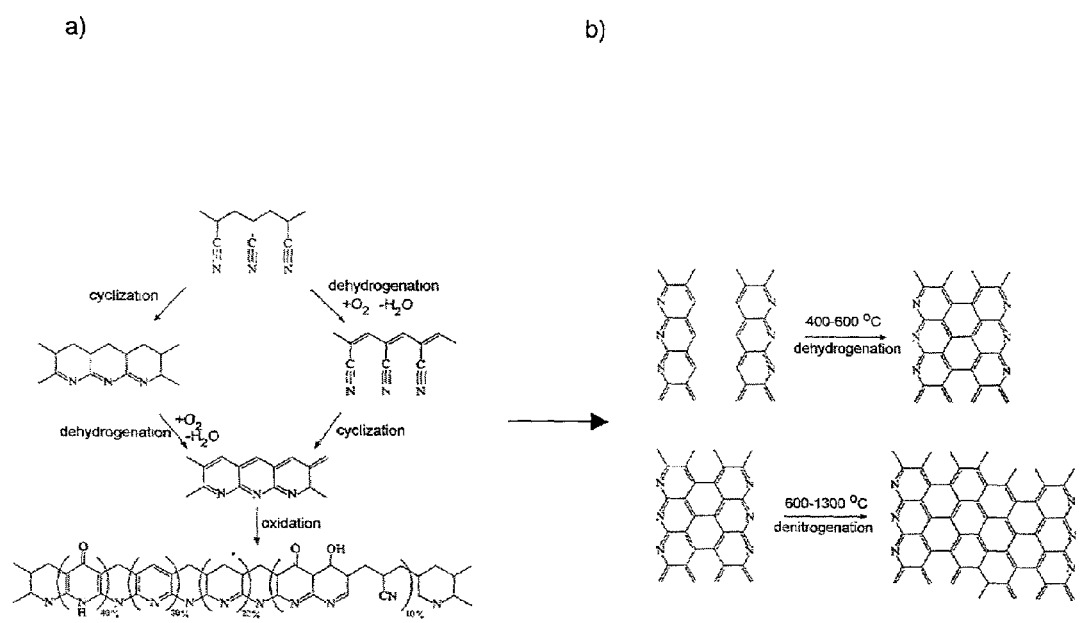
FIG. 14 is a schematic representations of the production of graphitic materials by the stabilization and pyrolysis of polyacrylonitrile (PAN), including a schematic representation of the chemical transformations in the thermal stabilization of the nanostructure of the phase separated polyacrylonitrile polymer and a schematic representation of the dehydrogenation and denitrogenation reactions of the proper pyrolysis of PAN which leads to the formation of the nanostructured materials.

The pyrolysis of PAN block copolymers resulted in semiconducting or conducting nanostructures, with increasing extents of graphitization. Not wishing to be limited by this description, the inventor believes this process occurs in several steps analogous to those established for PAN-based carbon fibers, Bajaj, P.; Roopanwal, A. K. *J. Macromol. Sci., Rev. Macromol. Chem. Phys.* 1997, C37, 97–147 see FIG. 14:

a) At temperatures above 200° C., in the presence of oxygen, crosslinking and some cyclization of phase separated PAN blocks occurs which stabilizes the morphology of PAN nanophase. This is very beneficial in that it prevents formation of a single phase consisting of PAN and the sacrificial block, which may occur above the order disorder transition (ODT) temperature during pyrolysis. At this stage, partial or even complete degradation of the sacrificial block occurs. Thus, this sacrificial block generally serves to develop and fix the PAN morphology.

b) At higher temperatures, in the absence of oxygen, PAN undergoes further cyclization and conversion to graphitic structures. The resulting material consists predominantly of carbon, with a small amount of remaining nitrogen. Our preliminary results show that with the increase of pyrolysis temperature, the optical absorption edge shifts towards longer wavelengths and materials pyrolyzed above ~600° C. become increasingly electrically conductive. Such behavior is consistent with the insulator-semiconductor-metal progression during heating, caused by the progressive closing of the bandgap. Interestingly, the nanofilament material exhibited a stronger red shift of the optical absorption edge with the increase of pyrolysis temperature than the nanospheres.

All these observations point to the possibility of tuning the bandgap of nanostructured carbons by varying the composition (and thus nanoscale morphology) of phase separated copolymer, and by varying the conditions of pyrolysis. Furthermore, one can envision the use of comonomers in the PAN phase, which could serve as donor or acceptor dopants for the carbon semiconductors. One could use boron or nitrogen containing monomers that would leave residual B or N in the carbon nanostructure and thus provide further tuning of the electronic properties of the final material.

Embodiments of the method of present invention for preparation of nanostructured materials from block copolymers of polyacrylonitrile is very robust, versatile, and highly amenable to scale-up. The thermal stabilization and pyrolysis steps may be carried out without sophisticated equipment, using simple pyrolysis, which may be easily implemented in continuous processes or in the field. In addition to applications discussed in detail, some other envisioned uses of nanostructured carbon materials manufactured using our approach include: activated carbons, materials for electronics, including, for example, field-emitter arrays for flat panel displays, photovoltaic cells, shielding materials, supports for catalysts, membranes, electrodes, hydrogen storage media for fuel cells, sensors, actuators, AFM probes, nanocomposites, well-defined carbon nanotubes and nanotube arrays, as well as other applications.

The tips of the nanofibers can be further functionalized. Functionalized carbon nanotubes may potentially be used as atomic force microscopy probes. Carbon nanotubes have diameters as small as one nanometer, have robust mechanical properties, and can be specifically functionalized with chemical and biological probes at the tip ends. Indeed the materials may be a foundation for a broad range of sensors and biosensors. Especially the family of sensors known as an "electronic nose" invented wherein changes in conductivity occur in carbon-black filled polymers upon swelling with different volatiles.

When the amount of filler is just below the percolation threshold for conductivity, even slight swelling of the polymer causes sharp changes in conductivity. Two dimensional arrays of just a dozen or so nanofibers may allow the preparation of an array of sensors that can detect and distinguish with much higher sensitivity a fairly wide range of different gases. This increased sensitivity attainable with a controlled distributed array of structures could lead to, and could extend the use of sensors, to liquids (the synthesis of an "electronic tongue").

Earlier investigations into the performance of nanotubes as scanning probe microscopy tips have focused on topographical imaging, but a potentially more significant applications of nanotubes can be probes that can sense or manipulate matter at the molecular level. Nanotube tips with the capability of chemical and biological discrimination can be created from carbon nanotubes with acidic functionality; for example, the preparation of such functional nanofibers are discussed in U.S. patent application Ser. No. 09/534,827 and by coupling basic or hydrophobic functionalities, or bimolecular probes, to the carboxyl groups that are present at the open tip ends of carbon nanotubes. As carboxyl groups are readily derivatized by a variety of reactions, the preparation of a wide range of functionalized nanotube tips should be possible, thus creating molecular probes with potential applications in many areas of chemistry and biology. Molecular-scale nanotube probes prepared by carbon vapor phase deposition have been used to image isolated IgG and GroES proteins at high-resolution. The application of carbon nanotubes as AFM tips could lead to breakthroughs in biological studies.

Another area that would benefit from a low cost supply of nanofibers are engineering plastics which may use nanostructured materials as additives for structural or high-tech applications like computer housing. Further the high mechanical strength, and exceptional thermal properties can provide temperature-resistant coatings. A further application that would benefit from this combination of high performance properties comprising high mechanical strength, and excellent thermal conductivity, seen from an array of carbon nanostructures deposited on mica, indicates a great potential for structural applications and protective temperature-resistant coatings with applications in traditional areas plus aircraft and space technology (space shuttle, satellites).

Carbon nanofibers give rise to antistatic behavior at even low concentrations, and at very moderate levels provide shielding for EMI electromagnetic interference: such shielding is used to protect laptops and other portable electronics, including cellular telephones, laptop computers and for radar absorption for stealth aircraft.

Nanostructured materials can be therefore added to polymers to make them antistatic, or for EMI shielding, but can additionally increase the engineering plastics toughness and strength, particularly if the nano-material has been functionalized to increase the interaction between the additive and the matrix material; see commonly assigned U.S. patent application Ser. No. 09/524,827 which is herein incorporated by reference for procedures to functionalize nanotubes and use of the attached functionality to prepare tethered (co)polymers suitable for blending applications. Nanostructured materials can provide high strength, lightweight nanostructured composite reinforcing agents including materials for carbon-reinforced electrodes specifically in high-surface area carbon electrodes.

Activated carbons and charcoals when used as catalyst supports have surface areas of about 1000 square meters per gram and porosities of less than one milliliter per gram. However, much of this surface area and porosity, as much as 50%, and often more, is associated with nanopores, i.e., pores with pore diameters of 2 nanometers or less. These pores can be inaccessible because of diffusion limitations. They are easily plugged and thereby deactivated. Thus, a high porosity material where the pores are mainly in the mesopore (>2 nanometers) or macropore (>50 nanometers) ranges are most desirable. The method of the present invention may be utilized to control the porosity of carbon nanotubes and hence the surface area of such structures. Further the mirror image of carbon nanotubes, carbon based nanostructures with controlled porosity of any desired dimension or structure can also be prepared.

High surface area nanotubes and carbon nanostructures should find application as nanostructured electrodes for fuel cells with capability to store hydrogen, particularly since use of graphitic materials for hydrogen storage has a long history.

Nanostructures are also useful in the preparation of strong nanocomposite materials or sensors that may imitate enzymes in molecular recognition.

The present invention also comprises arrangements and compositions of carbon nanostructures including ordered arrays of carbon nanostructures, porous nanostructures, functionalized nanostructures, including but not limited to, nanostructures comprising carbon, carbides, transition metals, and catalytic components and use of these novel organized carbon based structures in many applications as discussed herein.

In an embodiment of the present invention, using ABA block copolymers prepared by a controlled radical polymerization process, such as ATRP or RAFT, functionality may be incorporated into the carbon precursor block by polymerizing monomers comprising the desired functionality. Functional groups may be incorporated into a random copolymer, a periodic copolymer or a gradient copolymer or by partial reduction of the CN groups in a pure PAN block to provide distributed —NH2 functionality. Therefore, the functionality may be randomly distributed in the precursor phase, concentrated close to the B block of the phase separated copolymer resulting in functionality concentrated at the exterior of the nanofiber precursor phase or concentrated close to the interior of the nano-fiber precursor phase resulting in either a reinforced nano-fiber or a nanostructure with tailored functionality concentrated a functionalized interior pore of predeterminable diameter.

The incorporated functionality may be utilized to tailor the nanostructured material for many applications, such as, increasing the absorptive capacity of the carbon nanostructure or the functionality can first be employed to form transition metal complex or a transition metal salt within the nanofiber precursor phase and thereby allow the direct formation of a supported catalyst on a carbon structure or direct formation of a carbide species within the nanostructure or directly form a carbide nanostructure. Chain end functionality on the PAN precursor blocks can also be used to introduce specific functionality to the surface of the formed carbon based structures. The surface functionality may be designed to be a catalyst or a sensor. [Beers, K. L.; Woodworth, B.; Matyjaszewski, K. J. Chem, Ed. 2001, 78, 544–546]

Embodiments of the method of the present invention comprise a method of producing activated carbon structures having improved adsorption ability or comprising catalysts, such as transition metal catalysts, or carbides. These advantages are afforded by making activated carbon from a polymer wherein the phase separated carbon precursor phase additionally comprises functional groups which will ultimately enhance the adsorption properties of the activated carbon product. This precursor comprise the adsorption enhancing functional group or an adsorption functional additive may take the form of a coating on a substrate or comprise a shaped monolithic structure. Thereby, the activated carbon may be formed, as a free standing article, a film or membrane precursor, or can take the form of granules or other articles. The morphology of the phase-separated copolymer includes all morphologies present in phase separated domains of block copolymers of differing molar ratio's of the phases, including gyroid morphologies, with two interpenetrating continuous phases, and lamellar morphologies. Macrostructures comprising a nanostructured morphology may be prepared from a co-continuous biphasic precursor structure. Additionally, the precursor of the present invention may be fabricated into an article or granulated by extruding the thermoplastic (co)polymer into strands which may then be broken up. In another embodiment, the near final structure of the nanostructured material, including, but not limited to, films, fibers, granules and articles, is completed before carbonization of the precursor. The article comprising the nanostructure thereby includes membranes or articles comprising mesopores or macropores suitable for separation of molecules by size, or can provide constrained environments for shape selective catalysis, or provide high surface area structures.

The method of the present invention also includes precursors comprising mixtures of block copolymers and homopolymers or other doping materials wherein one can selectively "dope" the carbon precursor or the sacrificial phase to increase the phase separated volume of that phase. The copolymers themselves or the doping materials may comprise functionality to be incorporated into the nanostructured material including, but not limited to Si, S, P, B, and transition metals. Additionally, surfactants may be added to lower the surface energy of the precursor.

An embodiment of the present invention includes phase separated copolymers or added homopolymers comprising monomer units. The nanostructured material produced from this embodiment may be a nanocomposite which can comprise "nanoreinforced" ceramic materials.

This invention further relates to making carbide nanostructures. These advantages are afforded by making the carbide from a precursor comprising functional groups that form transition metal complexes or comprising added transition metal salts which after being pyrolyzed result in the formation of carbides. The precursor material phase may optionally additionally comprise a phase selective solvent or a phase selective solvent which comprises carbide or other stimuli responsive precursor materials.

Embodiments of the present invention comprise preparing two dimensional arrays of substantially perpendicularly oriented nanofibers on surfaces. The two dimensional arrays may be produced directly from a (co)polymer wherein the phase separated morphology comprises a precursor material phase organized as a cylinder in a film or a solution deposited on the surface. The thickness of the film influences the ultimate length of the nanofiber. The nanofibers of the two dimensional array may have substantially uniform aspect ratios. These arrays are quite stable and can survive subsequent pyrolysis steps, up to at least ~800° C. Indeed, a thick film of C-nanoclusters tremendously increases thermal stability of an object and remains mechanically stable after exposure to high temperatures. For instance, a mica substrate when protected with a thick film of C-nanoclusters stays intact when exposed to a torch flame, however, the unprotected mica decomposes when exposed to the torch flame.

Arrays of carbon nanotubes, fibers or other structures may be converted into a composite structure. It is believed to be possible to infuse the first formed two-dimensional array of nanostructures with monomers and polymerize the monomers in place to provide stability, insulation, or additional functionality, such as ionic porosity for diffusion of ionic species through the structure, or the array. Infusion with monomers followed by in-situ polymerization can form a polymer matrix which may, if desired, be employed to mechanically stabilize arrays with higher aspect ratios. Removal of this composite structure from the surface can further form unsupported electrically and thermally conductive films or other free standing structures. For example, such films ought to exhibit a very interesting anisotropy: good conductivity across the film and poor in-plane conductivity and therefore may find application as insulators, for example. When one infuses the array with a low or high molecular weight ceramic precursors subsequent pyrolysis forms conductive ceramic materials. Conductivity in combination with nanoscale morphology may yield some useful material properties particularly when the infused material precursor is an insulator or when the infused material precursor comprises an electrolyte either directly or after addition of ionic species.

The array of carbon nanotubes produced from the method of the present invention may be infused with a salt of a transition metal. It is believed this method would convert the surface of a carbon nanotubes into a carbide structure by a second pyrolysis reaction. Alternatively, supported catalysts may be prepared by incorporating transition metal(s) which can act as catalysts. Another embodiment of the method comprises soaking precursor materials (possibly after some preliminary pyrolysis steps to remove at lease a portion of the sacrificial phase) with a transition metal salt, such as a nickel chloride solution. Pyrolysis of the transition metal with the nanostructured material may produce carbon nanostructures with incorporated transition metals. It is also believed that incorporation of metals by electrochemistry (plating inside the carbon electrode) can be used to form such materials. The use of electrochemistry to modify the composition of ordered arrays of nanostructures could be extended to include the formation of hybrid materials. Further the array of carbon based nanostructures provides a means for organization of adsorbed molecules, including dyes, stimuli responsive organic molecules, semi-metallic species, metal ions or complexes on the surface of a substrate. The semi-metallic species, the metal ions and metal complexes may be reduced to provide ordered arrays on transition metals.

The transition metal catalysts of ATRP polymerizations optionally may be incorporated in the nanostructured material to form materials containing appropriate catalysts for additional reactions or for direct formation of carbide structures.

Further this invention also relates to arrays of oriented nanofibers in macro-fibers. Macro-fibers may be spun from phase separated copolymers, wherein each phase is a carbon precursor, one a macrofiber precursor and another is nanofiber precursor. Cylindrical domains of nanofiber precursor are initially oriented perpendicular to the fiber axis during annealing. The pyrolysis system may comprise enough overlap of carbonization conditions between the macro-fiber precursor and nanofiber precursor to form a macro-fiber with perpendicularly ordered nano-fibers. Such a structure offers a very high surface area construct for adsorption, or can act as a support for transition metal catalysts. Since catalytic activity is often dependent on surface area, a high effective surface area is desired. This method may maximize the surface area available and, therefore, access to incorporated functionality since the bulk macro-material is designed at the nano-level. This molecular level design of materials can also be applied and modified by preorganization at the macro-level, for example, through simple uniaxial drawing of the phase separated copolymer which would introduce orientation of macromolecules along the macro-fiber axis, and thus orientation of the nano-cylinders of phase separated nanofibers precursor may end up being perpendicular, or at an angle, or tangential to the drawing direction. The phase separated polymer chains can be oriented tangentially to the macro-fiber through a combination of spinning and twisting thereby providing a precursor for a self-reinforced carbon macro-fiber. The first formed biphasic macro-fiber can comprise two different carbon precursors, one to form a continuous macro-fiber after pyrolysis and one to form carbon nanostructures that act to reinforce the continuous phase.

A number of specific examples of the method of the present invention are presented herein, but should not be considered to limit the composition of the precursors or phase separated copolymers suitable for use in the present invention. The dimensions, structure, functionality and distribution of the nanostructured material comprising structures formed after pyrolysis or carbonization may be controlled by, for example, the size and shape and composition of the phase separated (co)polymer and by the dimensions precursor morphology.

Additional examples describe a PAN (co)polymer block, comprising in-chain or terminal functionality which may result in the formation of carbon structures with activated sites within the nano-composite structure or in the formation of multi-walled carbon nanotubes with a mesopore structure. The adsorption capacity of the nanostructures can be modified by incorporation of other elements into the first (co) polymer. The high nanoscale porosity of such structures will impact the utility of the carbon nanostructure.

Further when functional sites within the (co)polymer additionally comprise transition metal salts nanostructured catalysts or carbides can be formed.

Further when a thin film is pyrolyzed the PAN-based nanostructured thin films produced by pyrolysis can be successfully floated off of the substrate and onto bare grids or other supports, analogous to the standard method of transfer of formvar and/or thin amorphous carbon films.

The examples discussed in detail below are examples for the preparation and pyrolysis of thin films and ultrathin films that completely coat the substrate. However information gathered from analysis of partial coated substrate show the utility of the disclosed process for preparation of many future electronic devices.

DEFINITIONS

The term "effective surface area" refers to that portion of the surface area of a nanostructure (see definition of surface area) which is accessible to those chemical moieties for which access would cause a chemical reaction or other interaction to progress as desired.

"Graphitic" carbon comprises layers which may be substantially parallel to one another.

The term "mesopore" refers to pores having a cross section greater than 2 nanometers.

The term "nanofiber" refers to elongated structures having a cross section (e.g., angular fibers having edges) or diameter (e.g., rounded) less than 1 micron. The structure may be either hollow or solid. This term is defined further below.

The term "physical property" means an inherent, measurable property of the nanostructure.

The term "pore" refers to an opening or depression in the surface, or a channel through, a coated or uncoated nanofibers or in a carbon based structure.

A pore can be a single channel or connected to other channels in a continuous network throughout the structure.

The term "pyrolysis" refers to a chemical change in a substance occasioned by the application of heat.

The term "carbonization" refers to a conversion of a carbon-containing substance into carbon.

The term "surface area" refers to the total surface area of a substance measurable by the BET technique.

The term "thin coating layer" refers to the layer of substance which is deposited on a surface by the application of a polymer coating substance, this may be followed by pyrolysis of the polymer.

The term "ultra-thin film" refers to the layer of substance which is deposited on a surface by the application of a polymer coating substance, optionally in solution, and subjected to spin-coating to reduce the thickness of the film to the range from 10 nm–60 nm.

The term "thin film" refers to the layer of substance which is deposited on a surface by the application of a polymer coating substance, optionally in solution, and subjected to spin-coating to reduce the thickness of the film to the range from 60 nm–300 nm.

The term "thick film" refers to the layer of material deposited on a surface by the application of a polymer coating substance, optionally in solution, followed by drying of the film to provide a film with a thickness 300 nm or greater.

The term "supertip" refers to a nanofibers functioning as a sensitive tip for an AFM.

As used herein, the term "carbide" means a compound of carbon and one or two elements more electropositive than carbon, excluding hydrogen. The atoms in a carbide are covalently bound, the carbon atoms being generally $sp^3$ hybridized as in $Ta_2C$ and $Cr_3C_2$. In contrast, pure graphitic carbon (e.g., nanotube starting material) is $sp^2$ hybridized. Examples of binary carbides include $TiC_x$, $NbC_x$, and $SiC_x$ (wherein x is between 0.5 and 1.1), $Fe_3C_x$ (wherein x is between 0.8 and 1.2), and $BC_x$ (wherein x is between 0.1 and 0.3). Additional examples of binary carbides include $ZrC_x$, $HfC_x$, $VC_x$, $TaC_x$, $CrC_x$, $MoC_x$, $WC_x$, $NiC_x$, $LaC_x$, $CeC_x$, $PrC_x$, $NdC_x$, $SmC_x$, $GdC_x$, $DyC_x$, $HoC_x$, $ErC_x$, and $YbC_x$. Examples of ternary carbides include carbonitrides, carboborides, and carbosilicides and others such as $TiN_yC_x$, $MoN_yC_x$, and $SiN_yC_x$, $TiB_yC_x$, $TiTa_yC_x$, $TiSi_yC_x$, $TiNb_yC_x$, $MoSi_yC_x$, $MoB_yC_x$, $MoGa_yC_x$, $MoAl_yC_x$, $FeB_yC_x$, $FeSi_yC_x$, $FeNi_yC_x$, $SiB_yC_x$, $TaSi_yC_x$, $WSi_yC_x$, $ZrSi_yC_x$, $NbSi_yC_x$, $CrSi_yC_x$, $NdB_yC_x$, and $WCo_yC_x$. The values of x and y are, respectively, between 0.1 and 2.1 and between 0 and 0.9. Where y is 0, the carbide is a binary carbide consisting essentially of carbon and $M^1$ having the formula ratio of $M^1C_x$. Where y is greater than 0 (e.g., between 0.1 and 0.9), the carbide is a ternary carbide consisting essentially of carbon, $M^1$, and $M^2$ having the formula ratio $M^1M^2_yC_x$.

For the present purposes "polymers" include homopolymers and copolymers (unless the specific context indicates otherwise), which may be block, random, statistical periodic, gradient star, graft, comb, (hyper)branched or dendritic. The "(co)" parenthetical prefix in conventional terminology is an alternative, viz., "(co)polymer means a copolymer or polymer including homopolymer while "(co) polymerizable means a monomer that is directly polymerized by the polymerization mechanism being discussed and additionally a comonomer which can only be incorporated into the polymer by copolymerization. Similarly "(hyper)" is meant to incorporate the concept that the degree of branching along the polymer backbone can vary from a low degree of branching up to a very high degree of branching.

Here, and elsewhere in the text the word "control and/or controlled polymerization" means that in the polymerization process conditions are defined whereby the contributions of the chain breaking processes are insignificant compared to chain propagation, so that polymers with predetermined molecular weights, low polydispersity or tailorable polydispersity, and selected functionalities are achievable. The features of a controlled polymerization are well known and have been described in detail in U.S. patent application Ser. No. 09/972,260 which is herein incorporated by reference.

"Dope" means that an additional agent, a "dopant", is added to the copolymer. The additional agent can be a homopolymer with the same composition as one of the blocks in the block copolymer or can be an agent that adds functionality to the block copolymer.

"Anneal" means that the material is held at a known temperature or subjected to a heating cycle for a selected time.

When used in conjunction with a precursor phase "primarily" means that the phase can contain material that do not meet the pyrolysis requirements met by the bulk of the monomer units in this segment. An example would be a polyacrylonitrile segment that can contain a second monomer that will substantially not survive carbonization, such as a tapered or gradient copolymer formed with the carbon precursor, acrylonitrile and butyl acrylate, which can increase the surface area of the formed carbon nanostructure. Other monomers can comprise functional groups such as B, S, Si, P or transition metals that will add functionality to the final structure. The second monomer units may generally be present in less than 33% of the composition of the polymer segment, but may be more.

DISCUSSION OF EXAMPLES

The experimental work discussed in detail below on determination of the morphology of the nanostructured materials focuses carbon nanostructures formed by controlled pyrolysis of phase separated copolymers in the form of thin films and ultra-thin films employing proximal probe techniques, and in particular tapping mode AFM, which has therefore played an important role in the initial characterization of the nanostructures formed by controlled pyrolysis of phase separated block copolymers. The images presented in this application show that variable-force tapping techniques have been already proven very useful to study the nanoscale morphology of block copolymers, in particular in the systems with large difference of compliance between the phases, such as PAN-PBA phase separated block copolymers and are useful in the topographical evaluation of phase separated copolymers for pyrolysis wherein one phase is the carbon precursor phase and the other is the sacrificial phase. Use of a high temperature heater accessory allows us to study the thermal transitions in the range up ~250° C., i.e. sufficiently high to study the processes of annealing and thermal stabilization of nanostructure and the early stages of pyrolysis of a sacrificial block in PAN-PBA copolymers.

In addition to structural characterization, proximal probe techniques can be also used to study the electrical phenomena at the nanoscale. Here we use the electric force microscopy (EFM) approach that allow us oto directly observe field-induced doping in nanowires. These observations were carried out with incomplete monolayers of bundles of copolymer nanowires deposited on the surface of p-doped silicon wafer with native oxide layer. By preparing the samples in which nanowires only partially covered the silicon substrate surface, leaving large patches exposed, we were able to measure the phase shift above the native oxide on silicon and above the nanowires. As predicted, the phase shift above exposed substrate exhibited symmetric, parabolic dependence on tip-sample voltage. However the phase shift above the areas covered by nanowires was asymmetric with VDC, which led to remarkable contrast inversion of phase images with change of voltage sign.

No contrast inversion was observed in control experiments with discontinuous films of polystyrene spin-coated on the silicon substrate cut from the same wafer.

Figure 15:
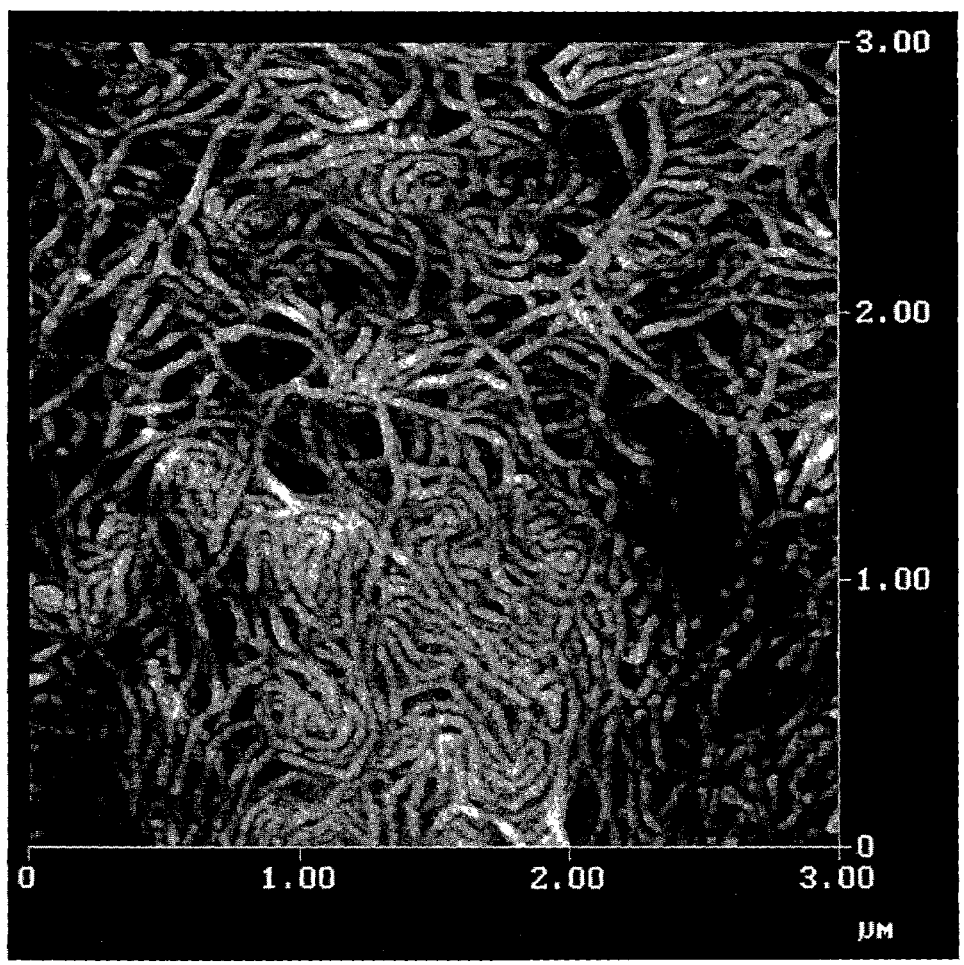
FIG. 15 is the image showing the morphology of carbon nanowires prepared by the method of the present invention which may be used to form nanoscale networks of internal donor-acceptor heterojunctions for use in photovoltaic cells.

The observed contrast inversion in EFM images may be a manifestation of field-induced doping of nanowires (injection of holes from the p-doped silicon substrate through the layer of native oxide). At negative tip-sample voltages, regions covered by nanowires behave as low dielectric constant dielectric layers, above which the tip-sample force is lower (and the force gradient less negative) than above the exposed substrate. Thus, in phase images acquired at VDC<0 nanowires appear "brighter" than the silicon substrate. For VDC>0, upon field-induced doping, by acquiring semi-metallic character, the nanowires become impenetrable to electric field and effectively behave as material of very high dielectric constant $\in_r$, which leads to more negative values of force gradient and consequently to more negative values phase shift $\Delta\phi$, manifested as contrast inversion. A modification of this approach, referred to as scanned gate technique has been very recently used to study field effect transistors made out of individual single wall carbon nanotubes. [Freitag, M.; Radosavljevic, M.; Zhou, Y.; Johnson, A. T.; Smith, W. F. *Appl. Phys. Lett.* 2001, 79, 3326–3328]. FIG. 15 is an image of nanowires produced from the method of the present invention.

The theory and experimental methodology for determining the structures of nanoparticles and carbon nanotubes have been extensively mapped out over the past decade. These approaches, described briefly below, are directly transferable to the study of the networked nanostructures such as the 3-D gyroid structure, or the interconnected parallel nanofiber structures, in thin film form. To determine structure, we can focus on electron nanodiffraction, selected-area electron diffraction (SAED), and high-resolution and scanning transmission electron microscopy (HR-TEM and STEM). To determine elemental composition we suggest that one can use electron energy loss spectroscopy (EELS) and energy dispersive spectroscopy (EDS), with emphasis on EELS due to the light elements (C, B, N) that are proposed as primary synthesis targets of nanocomposite structures formed from segmented copolymers comprising a functional comonomer in the segment forming the retained nanostructure, exemplified herein by the acrylonitrile segment. High-energy-resolution EELS can be used to address chemical bonding issues.

The most effective way to study these nanostructures is to use electron beams for diffraction and imaging. The focusing of electron beams by strong electromagnetic lenses leads to the imaging of assemblies of atoms with a resolution of order 0.2 nm, i.e., "atomic resolution" in electron microscopes. Also, the same lenses may be used to form electron beams of diameter as small as 0.2 nm so that diffraction patterns can be obtained from regions of such a diameter. The combination of the imaging and diffraction experiments of this sort should, in principle, provide all the information needed to map the structure of different regions of the networked C nanostructures.

Use of a variable temperature TEM stage capable of reaching 900° C. allows monitoring of the evolution of structural changes, as a function of heating, of the thin nanostructured C films. As such a thin film is pyrolyzed in situ in the TEM, it is of interest to monitor the mesostructure changes that occur by such curing in situ, as well as the detailed atomic structure of the component parts.

The formed thin films can be floated onto TEM grids as free standing structures for further study. Preliminary results show that the PAN-based nanostructured thin films produced by pyrolysis can be successfully floated off of the substrate and onto bare TEM grids, analogous to the standard method of transfer of formvar and/or thin amorphous carbon films as support films for TEM. Further electron-microscopy capabilities can be used for analyzing elemental composition of the thin film, networked C nanostructures, including those having other elements such as B, N, O, or others, present. EELS, which is analogous to x-ray absorption spectroscopy, is a particularly attractive technique to probe various aspects of atomic bonding, coordination, and valence of C nanostructures at a spatial resolution approaching a single atomic plane. A Gatan Imaging Filter (GIF) capable of obtaining energy-filtered images, diffraction patterns, and spatially resolved element- and bonding-specific images from EELS spectra. EELS has excellent energy resolution (<0.5 eV) which should prove useful to discriminate the nature of bonding of B, C, N, and 0 in these thin film materials. [Wang, Y. Y.; Cheng, S. C.; Dravid, V. P. *Micron* 1999, 30, 379–394; Wang Y. Y.; Cheng, S. C.; Dravid, V. P.; Chang, F. C. *Ultramicroscopy* 1995, 59, 109–119] With the GIF, element specific and fine structure specific energy windows may be used to spatially map the distribution of elements, and possibly their fine structure, at better than 1 nm resolution.

In addition to the use of electron microscopy to pinpoint structure and composition of individual nanotubes and nanowhiskers, we have previously found that surface analysis methods are important for surveying the bulk material, either as grown on substrates, or collected and re-deposited. The surface-analysis tools used for this proposed work include, AES, ESCA, STM, AFM, UHV STM, and TOF-SIMS system.

Classical semiconductor device characterization techniques include the Hall effect, optical spectroscopy, photo emission, four point probe resistivity, minority carrier time of flight, and AC suspectibility, for semiconductors and as well as many potential device structures, are well documented in several classical texts such as the one by S. M. Sze. [*Physics of Semiconductor Devices,* 1969; *Modern Semiconductor Device Physics,* 1998] Knowledge of the semiconductor electronic properties such as carrier type, carrier density, minority carrier life time, carrier transport mechanism, saturation drift velocity, band gap energy, density of states, band gap density of states, work function, and ionization energy, as well as of similar thin film surface properties, may be functions of material phase, temperature, strain, chemical dopant, and electric field.

Many of the electronic properties are highly influenced by the surface state or physical distortions of the crystalline structures. One of the more studied examples is conduction along carbon nanotubes. It is strongly influenced by surface chemical doping, application of electrical field, and by the ultimate strain and collapse of the nanotube. [Martel, R.; Schmidt, T.; Shea, H. R.; Hertel, T.; Avouris, P. *Appl. Phys. Lett.* 1998, 73, 2447–2449; Dai, H.; Kong, J.; Zhou, C.; Franklin, N.; Tombler, T.; Cassell, A.; Fan, S.; Chapline, M. *J. Phys. Chem. B* 1999,103,11246–11255] Since the atomic lattice spacing of these structures are well defined and the $\pi$—$\pi$ orbital overlap strongly affects the conductivity, it is understandable that mechanical strain or applied field should modulate electronic properties by distorting the electronic orbital configuration. Since many of the block copolymer structures synthesized by pyrolysis of phase separated copolymer precursors for the preparation of size selected nanostructures can be made porous, including the nanotubes, simply the variation of ambient moisture levels or temperature during electronic measurement leads to different results and perhaps differing mechanisms or radically different phenomena. Thus much of the electronic characterization must occur under controlled temperature and atmosphere, or even vacuum, conditions. On the other hand, while it is the very magnitude of these effects that make characterization and understanding difficult, is also the magnitude of these phenomena that hold promise for exploitation as sensors and active electronic devices. Compounding the challenge of characterization, even of the best prepared materials, is the considerably lower degree of defect free long-range order present in the structures. The more perfect structures of the present disclosure may enable a more complete understanding of the properties of electronic devices. Device structures may then progress from the present state with two-terminal resistors and p-n junctions, where the contact electrode forms one half of the junction, to three and four-terminal field dependent devices including field effect transistors (FET), photoconductive and photovoltaic devices, and cold field emissive cathodes.

Our experiments to characterize FETs include devices with channels comprised of nanostructured carbon materials. Since the nanostructures of interest can extend to micron dimensions, much useful knowledge of the material behavior can be gained from FETs made with conventional lithographic techniques. Automated Labview-controlled setups may be used to collect Id-Vd and Id-Vg curves to obtain consistent measurement results using in some cases application of gate and source-drain voltages up to 100 V. Data may be collected over a range of temperatures and in air, dry nitrogen, and vacuum in order to determine the effect of basic ambient conditions on FET performance. It has already been fairly well documented via Hall effect measurement that the C nanotubes can be strongly p-type, and that FET on-to-off ratios approaching a few hundred can be obtained. However, these properties have also been found to vary with sample preparation method and are author dependent.

Figure 16:
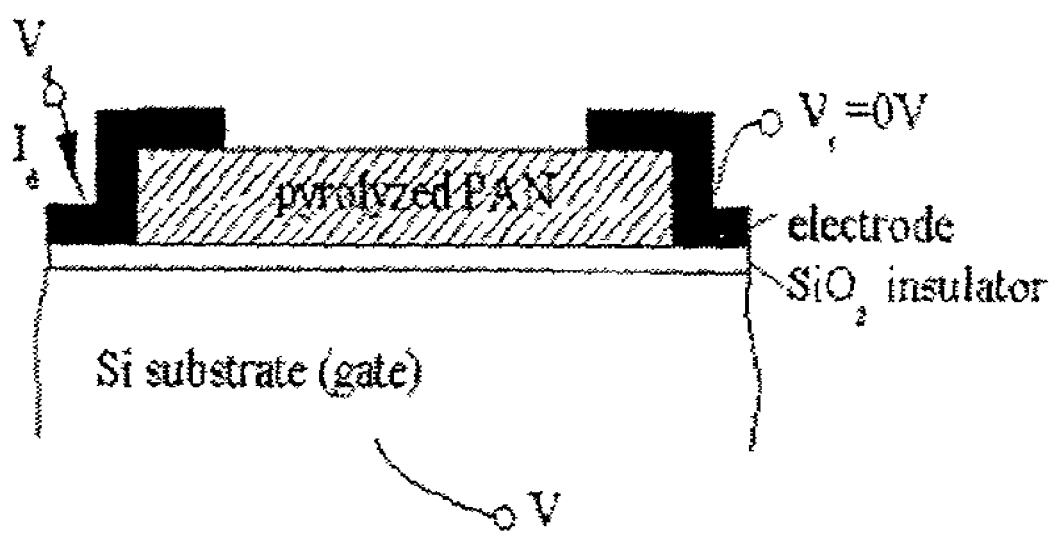
FIG. 16 is a graphical representation of nanostructured carbon FET produced from nanostructured material prepared from an embodiment of the method of the present invention.

Basic characterization devices may be made on silicon substrates with thermal oxidation to form the gate insulator, as shown in FIG. 16. As knowledge of properties vs. materials and processing conditions is obtained more sophisticated structures may be constructed with basic knowledge of FET devices. Substrates may be prepared with at least several gate thicknesses, ranging from around 50 to 300 nm. Source and drain electrodes may be made from a sputtered or evaporated metal with a high-temperature melting point. Electrode materials are critical and both metal, carbon, and conducting polymers may be used in forming ohmic contacts without affecting the channel material. FETs may be designed with a variety of gate widths and lengths ranging from around 1 to 25 μm to enable extraction of effective channel lengths and widths. We suspect that the transistor behavior may also be different across these size ranges as a transition takes place from single-nanowire spans across short channels to multiple-nanowire (bulk) behavior for long channel lengths.

Construction of a specialized vacuum system configured to allow some of the measurements, such as FET characteristics, Hall mobilities and resistivities and perhaps optical spectroscopy to be measured under controlled ambient conditions. Along with traditional band conduction we may expect to observe a combination of mechanisms represented via a blend of phenomena such as percolation, hopping, and tunneling or even ionic transport at the grain interfaces. Even if the localized internal grain structure (especially of a semiconductive material located in a heterogeneous matrix) has good electronic properties, but the grain boundary materials are significantly uncontrolled, then the properties can be highly dependent. This is especially true as a percolation limit is reached and the controlling conduction mechanism changes. With impurities, ohmic contact or tunneling across grain boundary interfaces may give way to other mechanisms such as ionic processes. Likewise, even if the crystalline phases are homogeneous, the electronic properties will still be a strong function of the relative orientation of the individual ordered grains to one another. Nanostructured carbon materials will significantly benefit from the alignment of nanostructures. And yet it may be very interesting to understand the relationship of conduction across an interface where two grains are intentionally mis-oriented.

Sensitivity to temperature, strain, optical exposure, and ambient conditions will shed knowledge on the basic excitation and conduction mechanisms. With proper substrate doping for simple surface contacts, we anticipate dielectric constants to be determined as a function of frequency. Hopping and ionic conduction mechanisms are quite often associated with what appears to be lossy dielectric processes. Of course to accomplish, this films must be pinhole free over the size of the electrode.

In the examples detailed below two different approaches were taken towards the polymerization of acrylonitrile initiated by poly(butyl acrylate)-based macroinitiator. First, conditions for the polymerization of butyl acrylate were defined then the polymerization of butyl acrylate was conducted using a bifunctional initiator, dimethyl 2,6-dibromoheptadioate (DM-2,6-DBHD), to prepare a difunctional macroinitiator with the measured molecular weight, 67.6 kg/mol. This macroinitiator was purified and used in subsequent examples to prepare block copolymers. Initially, the goal was to prepare ABA block copolymers comprising acrylonitrile blocks. The reactions were performed using the bromine terminated macroinitiator, and employed halogen exchange, i.e. with CuCl/bpy as the catalyst, to allow fast cross propagation and slower polymerization of acrylonitrile; Matyjaszewski, K.; Shipp, D. A.; Wang, J.-L.; Grimaud, T.; Patten, T. E. *Macromolecules* 1998, 31, 6836. Ethylene carbonate can be used as a solvent, but this is not necessary since low PDI polymers with predicted molecular weights may be synthesized in the absence of the solvent; Matyjaszewski, K.; Jo, S. M.; Paik, H.-j.; Gaynor, S. G. *Macromolecules* 1997, 30, 6398; Matyjaszewski, K.; Jo, S. M.; Paik, H.-j.; Shipp, D. A. *Macromolecules* 1999, 32, 6431–6438.

This approach allowed us to compare the mechanical properties and conformation of the copolymers on surfaces, of these first prepared block copolymers with a pure acrylonitrile block however block copolymers can also be formed with a spontaneous butyl acrylate-acrylonitrile-, (AN-BA) "gradient"; for example, (AN-BA)-block-BA-block-(AN-BA) copolymers. Both copolymers were prepared with the same molecular weight middle BA-block. The "gradient" block copolymers were prepared by direct addition of acrylonitrile to the active butyl acrylate polymerization reaction. The control was good in the continuous polymerizations (typical PDI values were below 1.2), and the polymers differed from the "pure" block copolymers; for instance, the pure block copolymers would not be soluble in THF, but the gradient copolymers are soluble in THF. In addition descriptions are also provided for the preparation and characterization of both "pure" and "gradient" forms of AB copolymers of BA and AN.

EMBODIMENTS OF THE INVENTION

Example 1

Preparation of Difunctional Poly(Butyl Acrylate)-Based Macroinitiator

Example 1A

This example was conducted as a typical atom transfer radical polymerization. All liquids used in the experiment, except the initiator dimethyl 2,6-dibromoheptadioate (DM-2,6-DBHD), were purged with nitrogen for at least one hour before addition to the reaction flask.

| Reactants: | | |
|---|---|---|
| CuBr | 0.0255 g | (0.178 mmol) |
| PMDETA | 0.0313 g | (0.181 mmol) |
| BA | 20 ml (17.88 g) | (139.5 mmol) |
| DM-2,6-DBHD | 38 µl (0.0604 g) | (0.175 mmol)—amount two times higher than the concentration of the catalyst (based on the bromine atoms) |
| PhOMe | 1 ml—standard for GC | |

The catalyst components, CuBr and PMDETA, were mixed together in a 50 ml Schlenk flask. A stirring bar was added and the flask was evacuated and filled with nitrogen three times. The monomer, butyl acrylate ("BA"), and the solvent, anisole, were than added, DM-2,6-DBHD, and the flask was immersed in an oil bath at 70° C. After the temperature had equilibrated the initiator, was added. Conversion was followed by periodically removing samples and determining the conversion and molecular weight of the formed copolymer by GC, the results are shown below in table 1A.

TABLE 1a

| Sample | Time of polymerization, hr | Conversion (GC) | $M_n \times 10^{-4}$, g/mol | PDI |
|---|---|---|---|---|
| 1 | 1 | 0.0512 | 0.689 | 1.42 |
| 2 | 4 | 0.1579 | 2.52 | 1.12 |
| 3 | 6 | 0.2775 | 3.35 | 1.10 |
| 4 | 9 | 0.4049 | 4.45 | 1.08 |
| 5 | 17 | 0.7693 | 5.65 | 1.10 |

The molecular weights shown in Table 1a. were determined based on a polystyrene standards, using THF as the eluent.

Example 1B

Scale-Up of the Synthesis of the Poly(Butyl Acrylate)-Based Macroinitiator

After clarifying the kinetics of the polymerization of butyl acrylate, example 1A, the preparation of the macroinitiator was scaled up. The procedure was slightly modified.

0.0775 g (0.540 mmol) CuBr was added to a 250 ml Schlenk flask, the flask was then closed, evacuated, and filled with nitrogen several times. A deoxygenated solution of 110 µl (0.0913 g, 0.527 mmol) PMDETA in 2 ml anisole was added, followed by 60 ml (53.64 g, 418.5 mmol) of butyl acrylate. The flask was then placed in an oil bath at 75° C., and a deoxygenated solution of 0.1817 g DM-2,6-DBHD in 3 ml anisole was added. After 16 hours the reaction was terminated and the polymer was dissolved in 200 ml tetrahydrofuran (THF), and the solution passed through an alumina column twice to remove the catalyst. The THF was evaporated from the polymer solution and the purified difunctional macroinitiator thus prepared was used for the subsequent polymerization of acrylonitrile. The molecular weight of the macroinitiator was measured, based on polystyrene standards, with 50 mM LiBr in DMF as the eluent and was determined to be $6.76 \times 10^4$ g/mol.

Example 2

Synthesis of Polyacrylonitrile Homopolymers

The homopolymers of acrylonitrile were prepared using the basic methods reported in the literature. Typically, the homopolymers were prepared in ethylene carbonate as the solvent, using halogen switch (copper (I) chloride-based complex as the catalyst with a bromine containing initiator). The well-defined homopolymers of AN may be used for both doping of the films based on the diblock and triblock copolymers, and for the preparation of polyacrylonitrile-based macromonomers, to be used for the preparation of comb-like copolymers with BA using a grafting through polymerization process such as described in application No. 60/257,738.

Example 2A

Preparation of Polyacrylonitrile Using Methyl Bromopropionate as the Initiator

| Reactants: | |
|---|---|
| Acrylonitrile ("AN") | 10 ml |
| ethylene carbonate ("EC") | 15 ml |
| CuCl | 0.0357 g ($3.6 \times 10^{-4}$ mol) |
| Bipyridine ("bpy") | 0.1131 g ($7.2 \times 10^{-4}$ mol) |
| Methyl bromopropionate ("MBP") | 40 □ |

The catalyst components, CuCl and bpy, were mixed in a Schlenk flask, which was then evacuated and filled with nitrogen. Then, degassed AN and EC were added, the mixture was immersed in a bath at 70° C., and the initiator was added. Conversions were determined by GC, and molecular weights were determined by GPC, using DMF as the eluent and polystyrene standards for the calibration. The results are given in table 2A.

TABLE 2A

| Sample | Time of polymerization, hr | Conversion (GC) | $M_n \times 10^{-4}$, g/mol | PDI |
|---|---|---|---|---|
| 1 | 0.5 | 0.215 | 1.705 | 1.41 |
| 2 | 1.25 | 0.306 | 2.702 | 1.35 |
| 3 | 2 | 0.410 | 3.477 | 1.29 |

The polymer at the end was isolated and purified by dissolving it in a small amount of DMF and precipitating in methanol. The homopolymer with the bromine end-group can be transformed directly to acrylate ester using the reaction with acrylic acid in the presence of DBU. But firstly, a reaction with a model compound, bromoacetonitrile, was performed.

Example 2A1

Reaction of Bromoacetonitrile and Acrylic Acid in the Presence of DBU

It has been reported in *Encyclopedia of Reagents for Organic Synthesis*, Paquette, L. A., ed., vol. 2, 1497–1503, Wiley, 1995; that the halogen atom in alkyl halides (mainly iodides and bromides) can be easily displaced by nucleophiles derived from acidic compounds in the presence of DBU, because the latter forms very stable and usually insoluble hydrohalide salts. The reactions are typically performed in weakly polar solvents like THF, but DMF or DMSO can also be used; they have been successfully applied for the preparation of esters. Since PAN is soluble in DMF a reaction of the model compound, bromoacetonitrile, was performed in this solvent.

1.37 ml (1.44 g, 0.02 mol) acrylic acid was dissolved in 10 ml DMF. The solution was prepared in 100 ml round-bottomed flask, immersed in water bath at 25° C., and stopped with a rubber septum. Then, 3 ml (3.045 g, 0.02 mol) DBU was added, followed by the dropwise addition of a solution of 1.39 ml (2.40 g, 0.02 mol) bromoacetonitrile in 10 ml DMF. The reaction mixture was stirred for 18 h, and then 50 ml water was added, and the product was extracted with ether. After removal of the ether, a NMR spectrum of the product was taken. It consisted of the following signals: $\delta$4.81 ppm (s, 2H), 6.03 ppm (dd, 1H), 6.17 ppm (dd, 1H), and 6.53 ppm (dd, 1H). For comparison, the spectrum of bromoacetonitrile consists of a singlet situated at $\delta$ 3.80 ppm. This result indicates that the reaction was successful. However, in PAN, there are acidic (due to the nitrile group) $\beta$-hydrogen atoms next to the end-group bromine, which could make possible also elimination reactions.

Example 2A2

Reaction of Bromine-Terminated PAN with Acrylic Acid in the Presence of DBU (Nvt-an4a)

1.2 g ($3.4 \times 10^{-5}$ mol) PAN of molecular weight 35 kg/mol (see nvt-an4) was dissolved in 15 ml DMF. To this solution, 0.24 ml (0.252 g, $3.4 \times 10^{-3}$ mol, 100-fold excess vs. the halide) acrylic acid was added, followed by the dropwise addition of 0.52 ml (0.529 g, $3.4 \times 10^{-3}$ mol, approximately a 100-fold excess vs. the halide) DBU. The reaction mixture was stirred in a 100 ml flask at 30° C. for 24 h. The obtained polymer was precipitated in methanol. It was orange-colored. This polymer was use in Example 2A3. as a macroinitiator for the preparation of a comb-like copolymer with BA.

Example 2A3

Preparation of Comb-Like Copolymer of BA and PAN Using pBA-Based Macroinitiator and PAN Macromonomer by Grafting through (Nvt-anbal 5)

| | |
|---|---|
| CuCl— | 0.0006 g ($6.06 \times 10^{-6}$ mol) |
| bpy- | 0.0018 g ($1.15 \times 10^{-5}$ mol) |
| PAN of M.W. 34.8 kg/mol | 1 g ($2.9 \times 10^{-5}$ mol) |
| Ethylene carbonate | 3 ml |
| Polymerization temperature | 70° C. |

The mixture of the solids was added to a flask, which was then evacuated and filled with nitrogen several times. Then, bubbled with nitrogen and ethylene carbonate was added. To this mixture, a well-deoxygenated solution of 0.084 g ($1.4 \times 10^{-}$mol) of pBA macroinitiator of M.W. 59 kg/mol in 2 ml THF was added. The reaction mixture was then stirred at 70° C. for 18.5 h. The resulting copolymer was isolated by precipitation in methanol. Its molecular weight in DMF was determined to be 42 kg/mol, PDI=1.33 (as compared with polystyrene standards). For comparison, the molecular weight of the PAN macromonomer was 34.8 kg/mol, PDI=1.29. There is some indication of an increase of the molecular weight, but due to the difficulty in analyzing molecular weight of polymers of complex architectures by GPC the relatively small indicated change of molecular weight can be in fact much more significant.

Example 2B

Preparation of Polyacrylonitrile Using 2-hydroxyethyl 2-bromo2-methylpropionate (HEBiB) as the Initiator The polymer containing terminal hydroxyl group can be converted to ester of (meth)acrylic acid, and therefore, used as a macromonomer.

| Reactants: | |
|---|---|
| acrylonitrile | 20 ml |
| ethylene carbonate | 30 ml |
| CuCl | 0.0720 g ($7.25 \times 10^{-4}$ mol) |
| bpy | 0.2262 g ($1.44 \times 10^{-3}$ mol) |
| HEBiB | 150 μl ($7.2 \times 10^{-4}$ mol) |

The catalyst components were mixed in a Schlenk flask, which was then evacuated and filled with nitrogen. Then, degassed AN and EC were added, the mixture was immersed in a bath at 70° C., and the initiator, HEBiB, was added. After 2 hours, the conversion (by gravimetry) was 68%. The molecular weight of the polyacrylonitrile (GPC in DMF, vs. polystyrene) was $3.73 \times 10^{-4}$ g/mol, PDI=1.28. The polymer was purified by dissolving it in a small amount of DMF and precipitating in methanol.

Example 2B1

Transformation of the Bromine End-Group to Azide (Nvt-an3a)

The reaction was done at conditions similar to those described earlier by Coessens, V., Matyjaszewski, K., *J. M. S.—Pure Appl. Chem.*, A36, (5&6), 667–79 (1999). 6.60 g ($1.8 \times 10^{-4}$ mol) PAN (nvt-an3) was dissolved in 50 ml DMF. On stirring, 1.17 g (0.018 mol, 100-fold excess) sodium azide was added. The mixture was stirred at 30° C. for 32 hours and the obtained polymer was precipitated in methanol and dried.

Example 3

Preparation of ABA Block Copolymers with poly(butyl acrylate) as the Middle (B) Block and Pure Polyacrylonitrile as the Side (A) Blocks Example 3A Polymerization of Acrylonitrile Initiated by poly(butyl acrylate)-Based Macroinitiator in the Presence of Ethylene Carbonate as the Solvent The reaction was carried out using the difunctional poly (butyl acrylate)-based macroinitiator prepared above. The initial polymerization experiments were performed using ethylene carbonate as the reaction medium. The macroinitiator is readily soluble in acrylonitrile and it is probable the same holds for the copolymer, so it should be possible to carry out the reaction in the absence of ethylene carbonate. All liquids were purged with nitrogen for at least one hour prior to the experiment.

| Reactants: | | |
|---|---|---|
| Macroinitiator | 4.09 g | (0.061 mmol) |
| Acrylonitrile | 5 ml (4.03 g) | (76 mmol) |
| Ethylene carbonate | 2.5 ml | |

The above components were mixed together and the mixture purged with nitrogen. In order to assist in the dissolution of the macroinitiator, it is useful to sonicate the mixture for 1–2 minutes in a cleaning bath. Under these conditions, an emulsion-like (slightly turbid) liquid is formed. The catalyst was prepared by adding a mixture of 0.0124 g CuCl (0.12 mmol) and 0.0396 g bpy (0.25 mmol) to a 10 ml Schlenk tube, a stirring bar was added, and then the flask was evacuated and filled with nitrogen several times. This preformed catalyst mixture was added to the above solution of the macroinitiator and acrylonitrile and the polymerization was carried out at 70° C. The molecular weights were determined in 50 mM LiBr in DMF with polystyrene standards. The composition of the copolymer is $(AN)_{379}$-$(BA)_{527}$-$(AN)379$ based on GPC analysis.

Example 3B

Polymerization of Acrylonitrile Initiated by poly(butyl acrylate) Macroinitiator Without Use of a Solvent All liquids were purged with nitrogen for at least one hour prior to the experiment.

| Reactants: | |
|---|---|
| Polybutyl acrylate macroinitiator | 2.06 g (0.03 mmol) |
| Acrylonitrile | 10 ml (8.06 g, 152 mmol) |
| Anisole | 2 ml |

The above components were mixed, the mixture purged with nitrogen. 0.0063 g CuCl (0.06 mmol) and 0.0200 g bpy (0.12 mmol) were added to a 50 ml Schlenk flask, and the mixture was stirred, as the flask was evacuated and filled with nitrogen several times. The above solution was added to this catalyst mixture and the polymerization was carried out at 70° C. The reaction mixture became increasingly viscous, and after 19 h, it was impossible to stir it. It was homogeneous (no precipitation was observed.) The molecular weights of samples taken at different stages of the polymerization were determined in 50 mM LiBr in DMF with polystyrene standards and the results are shown in Table 3B.

TABLE 3B

| Sample | Time of polymerization, h | $M_n \times 10^{-4}$, g/mol | PDI |
|---|---|---|---|
| Macroinitiator | 0 | 6.76 | 1.16 |
| 1 | 0.5 | 6.82 | 1.17 |

TABLE 3B-continued

| Sample | Time of polymerization, h | $M_n \times 10^{-4}$, g/mol | PDI |
|---|---|---|---|
| 2 | 1 | 6.19 | 1.18 |
| 3 | 4.5 | 6.04 | 1.19 |
| 4 | 19 | 9.77 | 1.36 |

No precipitation is observed during the course of the reaction.

Example 3C

Preparation of AN-BA-AN Block Copolymer from poly(butyl acrylate)-Based Macroinitiator in the Absence of Solvent This experiment was performed at the same conditions as example 3B in heck whether the observed slow addition of acrylonitrile to the poly(butyl acrylate)-based macroinitiator in the absence of ethylene carbonate will be observed again. In this case the conversion of acrylonitrile was continuously followed by GC.

| Reactants: | |
|---|---|
| CuCl | 0.0063 g |
| bpy | 0.0202 g |
| BA-based macroinitiator of $M_n = 6.76 \times 10^4$ g/mol | 1.99 g |
| AN | 5 ml |
| Anisole | 2 ml |

After 20 h, the reaction mixture was a transparent brown-colored "solid" (gel-like). The final polymer is not soluble in THF but the THF swells the polymer. It is readily soluble in DMF. The molecular weights of the polymers were determined by GPC using 50 mM LiBr in DMF as the eluent with polystyrene standards and are given in Table 3C.

TABLE 3C

| Sample | Time of polymerization, h | Conversion (GC) | $M_n \times 10^{-4}$, g/mol | PDI |
|---|---|---|---|---|
| Macroinitiator | — | — | 6.76 | 1.16 |
| 1 | 1 | 0.0992 | 7.539 | 1.25 |
| 2 | 3 | 0.1408 | 7.600 | 1.25 |
| 3 | 6 | 0.1691 | 7.795 | 1.27 |
| 4 | 7 | 0.1203 | 8.655 | 1.22 |
| 5 | 20 | 0.4990 | 10.78 | 1.26 |

Although the semilogarithmic plot was curved, a linear increase of molecular weight with conversion was observed.

Example 4

Preparation of an AB poly(butyl acrylate-b-acrylonitrile) Block Copolymer

A diblock copolymer of butyl acrylate and acrylonitrile was prepared in order to study its morphology by AFM and compare it with the AN-BA-AN and (AN-BA)-block-BA-block-(AN-BA) triblock copolymers. A monofunctional poly(BA) macroinitiator was synthesized, and then chain-extended with AN using ethylene carbonate as the solvent.

Example 4A

Preparation of Monofunctional poly(butyl acrylate) Macroinitiator

| Reactants: | | |
|---|---|---|
| MBP | 8 μl | (0.067 mmol) |
| CuBr | 0.0098 g | (0.067 mmol) |
| PMDETA | 14 μl | (0.067 mmol) |
| BA | 15 ml | (105 mmol) |
| anisole | 1 ml | |
| Reaction Temperature = 70° C. | | |

The catalyst mixture (CuBr and PMDETA) was put in a Schlenk tube and oxygen removed by successive evacuation and filling with nitrogen. Then, purged butyl acrylate and anisole were added. The tube was put in a bath at 70° C., and the initiator was added. The results are presented in Table 4A.

TABLE 4A

| Time of polymerization, h | Conversion (GC) | $M_n \times 10^{-4}$, g/mol | PDI |
|---|---|---|---|
| 1.5 | 0.020 | 0.809 | 1.50 |
| 13.75 | 0.105 | 37.16 | 1.23 |
| 18 | 0.195 | 45.24 | 1.21 |

The obtained polymer solution was then diluted with THF (about 100 ml), and the solution was passed through an alumina column. The alumina was then washed with an additional amount of THF. Then, the THF and residual remaining butyl acrylate were removed by evaporation under vacuum at 80° C. The isolated colorless polymer was analyzed by GPC again, using DMF as the eluent. The determined molecular weight was 53.01 kg/mol, PDI=1.18. All measurements of molecular weights were based on polystyrene standards.

The final macromonomer contained unreacted BA, which was not removed since all of the butyl acrylate (co)polymer is essentially sacrificial material, whose only purpose is to define the spacing of the polyacrylonitrile precursor phase separated domains and the ultimate spacing of the carbon nanostructured array. Indeed "free" sacrificial material, in this case polybutyl acrylate, can be added to increase the spacing of the nanostructured array as desired.

Example 4B

Preparation of "Gradient" BA-b-(AN-BA) AB Block Copolymer

| Reactants; | | |
|---|---|---|
| BA-based macroinitiator of MW = 53 kg/mol (see 4A) | 5.04 g | (9.5 × 10⁻⁵ mol) |
| CuCl | 0.0096 g | (9.5 × 10⁻⁵ mol) |
| bpy | 0.0297 g | (1.9 × 10⁻⁴ mol) |
| AN | 5 ml (4.03 g) | (0.076 mol) |
| Ethylene carbonate | 2 ml | |
| Reaction Temperature = 70° C. | | |

The macroinitiator (still containing some residual BA from preparation of the macroinitiator) was dissolved in a solution of acrylonitrile in ethylene carbonate (the liquid reagents had previously been purged with nitrogen for 5 h). The solution was degassed (freeze, pump, thaw—3 times), then the flask was filled with nitrogen, and the catalyst mixture (CuCl and bpy) was added to the frozen mixture. The flask was evacuated and filled with nitrogen while the mixture inside was frozen. The polymerization reaction was carried out at 70° C. The results are presented in Table 4B. The product was not pure diblock copolymer, but rather BA-(AN-BA) gradient) diblock since the macroinitiator contained some unreacted BA monomer which would be incorporated into the acrylonitrile block. The presence of such sacrificial butyl acrylate in the PAN block would increase the surface area on the formed carbon nanostructures after pyrolysis by providing a source of nano-pores.

TABLE 4B

| Time of polymerization, h | Conversion (GC) | $M_n \times 10^{-4}$, g/mol | PDI |
|---|---|---|---|
| 7 | 0.256 | 55.56 | 1.18 |
| 19 | 0.332 | 56.24 | 1.15 |

Example 4C

Scaling-Up the Preparation of Monofunctional poly(butyl acrylate) Macroinitiator

| Reactants: | | |
|---|---|---|
| MBP | 32 μl | (0.268 mmol) |
| CuBr | 0.0392 g | (0.268 mmol) |
| PMDETA | 56 μl | (0.268 mmol) |
| BA | 25 ml | (175 mmol) |
| anisole | 2 ml | |
| Reaction Temperature = 70° C. | | |

The catalyst mixture (CuBr and PMDETA) was added to a Schlenk tube and oxygen removed by successive evacuation and filling with nitrogen. Then, purged butyl acrylate and anisole were added. The reaction tube was placed in a bath at 70° C., and the initiator was added. After 20 hours (conversion 81.1% based on GC), the obtained polymer was isolated and purified, catalyst removed, by passing its solution in THF through a column filled with alumina. The molecular weight of the homopolymer macroinitiator, after removing the unreacted BA by drying in vacuum at 70° C. to a constant weight was determined by GPC (DMF as the eluent, polystyrene standards) as 59 kg/mol, PDI=1.33.

Example 4D

Preparation of "Pure" (BA-b-AN) AB Block Copolymer

| Reactants; | | |
|---|---|---|
| BA-based macroinitiator of MW = 59 kg/mol (see 4C) | 3.757 g | ($6.4 \times 10^{-5}$ mol) |
| CuCl | 0.0063 g | ($6.4 \times 10^{-5}$ mol) |
| bpy | 0.0202 g | ($1.3 \times 10^{-4}$ mol) |
| AN | 10 ml (8.06 g) | (0.152 mol) |
| Ethylene carbonate | 3 ml | |
| Reaction Temperature = 70° C. | | |

The macroinitiator was mixed with the catalyst mixture (CuCl and bpy). The flask was evacuated and filled with nitrogen three times. The monomer and EC were then added. The polymerization was carried out at 70° C. The results are presented in Table 4D.

TABLE 4D

| Time of polymerization, h | Conversion (GC) | $M_n \times 10^{-4}$, g/mol | PDI |
|---|---|---|---|
| 2 | 0.229 | 7.24 | 1.19 |
| 14 | 0.291 | 7.83 | 1.23 |
| 21 | 0.515 | 8.17 | 1.25 |

The polymer was purified by precipitating it in methanol.

Example 5A

Polymerization of Acrylonitrile Initiated by a Difunctional poly(butyl acrylate) Macroinitiator Prepared in situ (Spontaneous Gradient Copolymer as the A Block)

All liquids were purged with nitrogen for at least one hour prior to the experiment.

| Reactants: | |
|---|---|
| CuBr | 0.0064 g (0.0445 mol) |
| PMDETA | 0.0081 g (0.0445 mol) |
| DM-2,6-DBHD | 9.5 µl |
| BA | 6 ml |
| Anisole | 0.5 ml |

The CuBr and the ligand were mixed in a 25 ml Schlenk flask. A stirring bar was added, the flask was sealed, and was evacuated and filled with nitrogen several times. A solution of anisole and the monomer was then added and the reaction mixture was immersed in an oil bath at 70° C., prior to the addition of the initiator. After 13.5 h, the reaction mixture was cooled to room temperature, samples for GC analysis of conversion and GPC were taken. The results are shown as the first entry in table 5A. 5 ml acrylonitrile and 2 ml ethylene carbonate were added to the solution and the mixture was heated again at 70° C. for additional 10 h. At the end of this period the reaction mixture was green color indicating that the catalyst system had oxidized. (It is possible that the amount of Cu(1) was not sufficient, and in the next experiment an additional aliquot of CuBr/bpy was added with the acrylonitrile.) At the end of the reaction, the resulting polymer was precipitated in methanol. It was rubbery material, soluble in THF. The molecular weights of the first formed pure butyl acrylate macroinitiator and the copolymer were determined in this solvent using polystyrene calibration. The results are shown in table 5A.

TABLE 5A

| Sample | Time of polymerization, h | Conversion (GC) | $M_n \times 10^{-4}$, g/mol | PDI |
|---|---|---|---|---|
| BA-based macroinitiator | 13.5 | 0.6980 | 6.593 | 1.11 |
| Copolymer of BA and AN | 13.5 + 10 | 0.6993 (BA) 0.1197 (AN) | 7.389* | 1.22 |

*The copolymer contained a small amount of high molecular weight fraction (M > $10^6$ g/mol).

As seen from the above Table 5A, after the addition of acrylonitrile almost no further copolymerization of butyl acrylate is seen—the overall conversion of BA remains the same, within the sensitivity of the analytical tools used, till the end of the reaction.

Example 5B

Polymerization of Acrylonitrile Initiated by a Bifunctional poly(butyl acrylate) Macroinitiator Prepared In Situ, Gradient AN-BA Copolymer A Blocks, in the Presence of Higher Amount of Activator

| Reactants: | |
|---|---|
| CuBr | 0.0062 g (0.0444 mol) |
| PMDETA | 0.0081 g (0.0445 mol) |
| DM-2,6-DBHD | 9.5 µl |
| BA | 6 ml |
| Anisole | 0.5 ml |

The procedure was the same as the one used in experiment 4A. After 12.5 h, the reaction mixture was cooled to room temperature, samples for GC analysis of conversion and GPC were taken. A solution of 0.0062 g (0.0444 mol) CuBr and 0.0139 g (0.085 mol) bpy in 5 ml acrylonitrile and 1.5 ml ethylene carbonate (purged with nitrogen) was added. Then the mixture was heated again at 70° C. After 8 h, a sample was taken to determine conversions and molecular weight. The reaction was stopped after 21.5 h. At that point, the reaction mixture was still brown. The resulting block copolymer was precipitated by addition to methanol. It precipitated as a semiliquid (glue-like) material which was soluble in THF. The molecular weights of the polybutyl acrylate macroinitiator and the copolymer were determined in THF using calibration with polystyrene standards.

TABLE 5B

| Sample | Time of polymerization, h | Conversion (GC) | $M_n \times 10^{-4}$, g/mol | PDI |
|---|---|---|---|---|
| BA-based macroinitiator | 12.5 | 0.4346 | 4.377 | 1.11 |
| Copolymer of | 12.5 + 8 | 0.4601 (BA) | 5.482 | 1.14 |

TABLE 5B-continued

| Sample | Time of polymerization, h | Conversion (GC) | $M_n \times 10^{-4}$, g/mol | PDI |
|---|---|---|---|---|
| BA and AN (1) Copolymer of BA and AN (2) | 12.5 + 21.5 | 0.5372 (AN) 0.4904 (BA) 0.6492 (AN) | 5.554 | 1.16 |

Again, it is seen, from Table 5B, that after the addition of acrylonitrile to the reaction mixture the remaining butyl acrylate is consumed very slowly. The conversion of butyl acrylate increases insignificantly while acrylonitrile reacts with the preformed difunctional macromolecule. In this case, it is seen that the acrylonitrile is consumed relatively rapidly (compared to the 12% conversion after 10 h in the previous experiment when no additional CuBr was used).

Example 6

AFM Studies of the AN-BA-AN Copolymers

The first two of the prepared AN-BA copolymers studied by AFM were the sample prepared in example 5A using ethylene carbonate as the solvent, and the polymer prepared in example 3C prepared without solvent. The compositions of these two copolymers are:

Material prepared in example 5A:

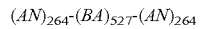

Material prepared in example 3C:

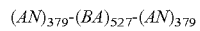

Film Preparation

Ultra-thin copolymer films were prepared by spin coating casting from 2 mg/mL-50 mg/mL solutions in DMF onto freshly cleaved mica or onto silicon wafer chips with native oxide layer on the surface. Silicon substrates were cleaned by "spin rinsing" with acetone. (The ~1 cm×1 cm silicon chip is mounted on a spin-coater, flooded with ~100 μL of acetone and spun up to >6000 r.p.m.; the "spin rinse" was repeated at least three times. Its major effect was removal of silicon dust particles that typically contaminate the surface when the wafer is scored in the process of cutting it into smaller pieces.) Thickness of ultra-thin films in the range from ~10 nm–60 nm was determined by measuring the depth of holes machined with the AFM probe operated in contact mode.

Thick films (from hundreds of nanometers to microns) were prepared by placing a drop of solution on the substrate and allowing the solvent to evaporate freely.

AMF of Cast Films.

The samples on silicon or mica surfaces were scanned using the tapping mode under ambient conditions. Visualization of phase separated PAN domains in the PBA matrix was possible owing to different compliances of both phases (rigid PAN and soft PBA). In ultra-thin films PAN phase always had the appearance of uniformly-spaced circular domains, with the average center-to-center spacing ranging from ~30 nm for sample prepared in example 5A to ~34 nm for sample 3C. Circular shape of domains in AFM images may indicate that they are either spheres or cylinders oriented perpendicular to the surface. Given the small volume fraction of PAN in sample prepared in example 5A, its domains are indeed expected to have a spherical shape in the BA phase. In contrast, 3C is expected to form cylindrical domains. This expectation was confirmed by the observation of thick films of 3C: in addition to circular shapes, highly elongated meandering domains (cylinders laying flat) were observed, see FIG. 1. Upon 1–2 hr vacuum-annealing at temperatures 200–220° C. (above the solid-melt transition of PAN phase) and cooling to room temperature, the morphology of thick films of sample 3C changed to domains with circular appearance, see FIG. 3. Such transition indicates that the initial morphology with some cylinders oriented parallel to the surface was thermodynamically unfavorable and was transformed into the morphology with cylinders oriented perpendicular to the surface. Similar morphologies and transitions were observed in thin and ultra-thin films of other block copolymers forming cylindrical phases. They are the manifestation of the interplay between surface energies of both phases, their mutual interfacial free energies and their interfacial free energies with the substrate, and point to the role of kinetics and thermal history in the formation of phase separated nanostructures. The process of annealing reduced the surface free energy of the sample. The distance between the phases was highly uniform and reproducible across the samples and between different samples of the same copolymer.

The two observed regions, in the case of the polymer prepared in example 5A, show a periodicity about 30 nm, whereas in the case of example 3C it is about 35 nm; as would be expected for a polymer with a higher molecular weight polyacrylonitrile block.

Example 6A

Carbonization of Example 3C: $(AN)_{379}$-$(BA)_{527}$-$(AN)_{379}$

Thermal treatment

Figure 3:
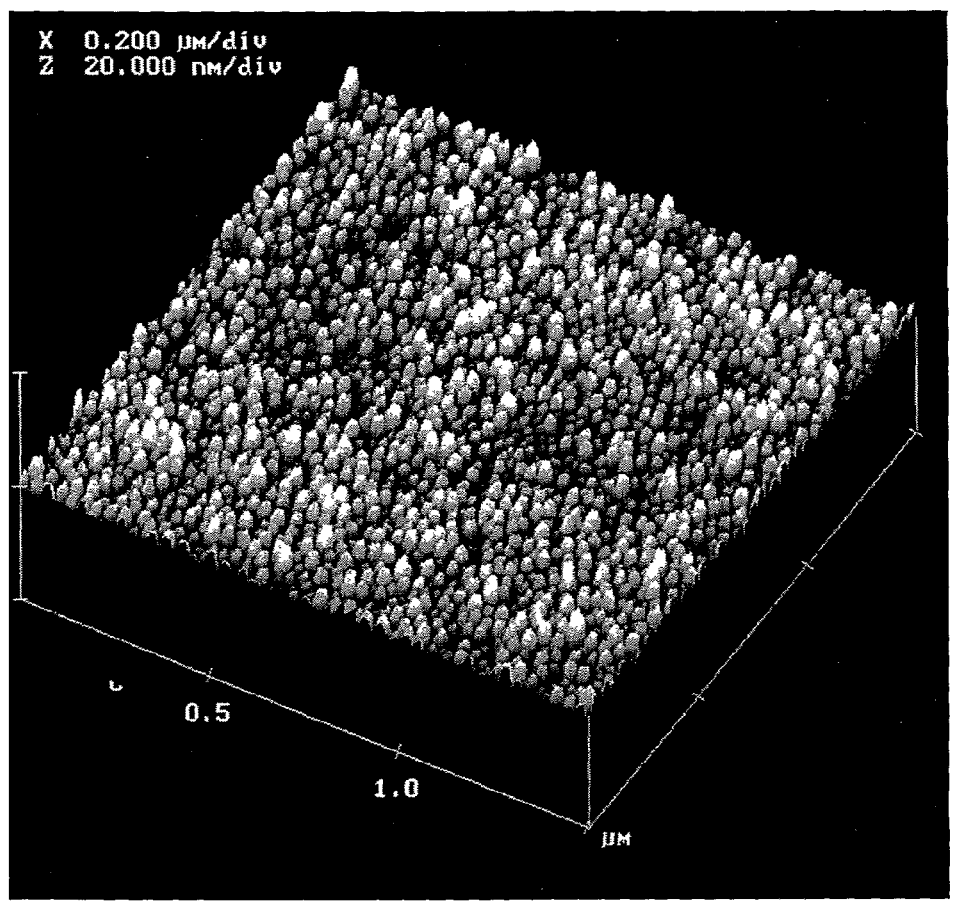
FIG. 3 is a atomic force microscopy image of an annealed cast film of the precursor comprising a $(AN)_{379}$-$(BA)_{527}$-$(AN)_{379}$ polymer showing the more well defined regular arrays of the precursor phase after the cast film of FIG. 1 has been vacuum annealed for 1–2 hours at a temperature between 200–220° C.

In order to assure orientation of PAN cylinders perpendicular to the surface the samples were annealed for 1–2 hrs at 200–230° C. in a vacuum oven, see FIG. 3. Subsequently, they were annealed for 1–2 hrs in air at 200–230° C. in order to ensure oxidative stabilization of the PAN which was critical for the survival of PAN domains upon subsequent carbonization, see FIG. 4. The samples were then heated at a rate of 20° C. 1 min under nitrogen purge thereby increasing the temperature from 200–1200° C. The final step involved holding the sample for ½ hr–1 hr at 1000–1200 C, see FIGS. 5 and 6.

FIGS. 3 through 6 show the evolution of the phase separated PAN domains in the copolymer into discrete carbon nano-fibers as the film is progressively subjected to the thermal treatment. Note how the ordered distribution of PAN domains in the initial cast film of FIG. 1 on a surface is converted into an ordered array of nano-fibers in FIGS. 5 and 6.

Example 7

Figure 17:
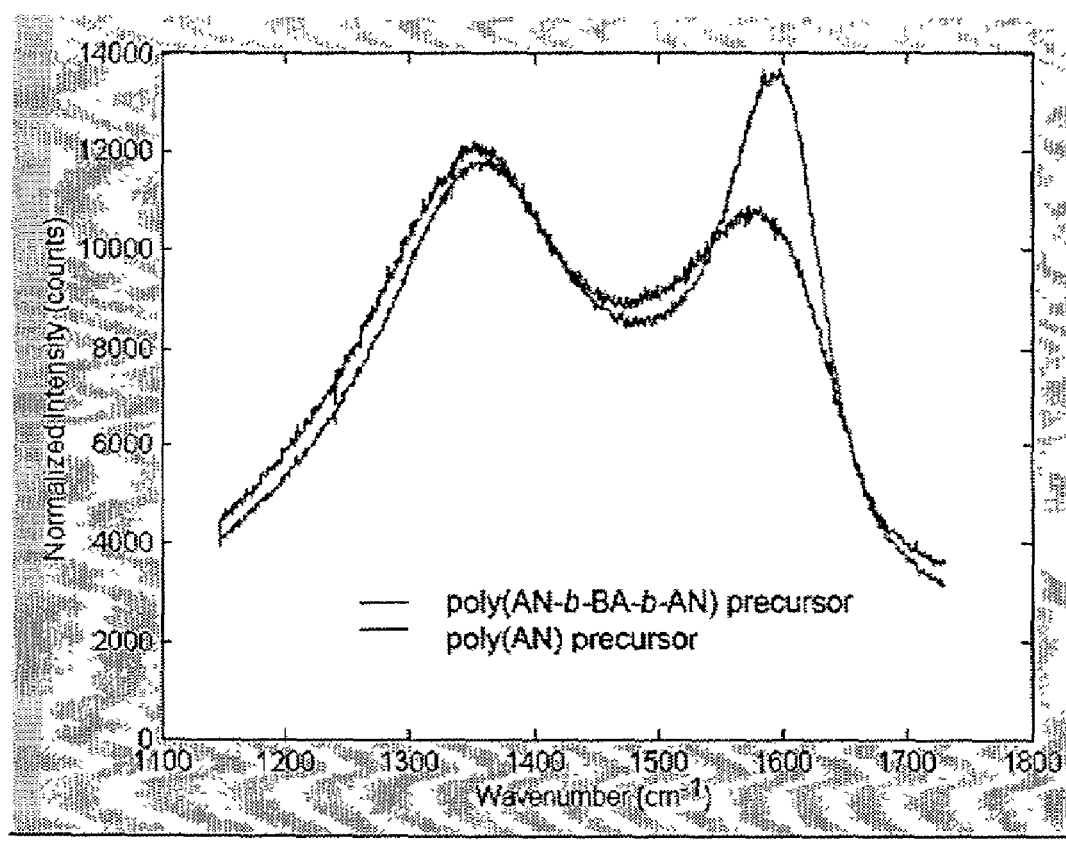
FIG. 17 is a comparison of the Laser Raman spectroscopy images of a material prepared by the vacuum annealing at 210° C. for 2 hours, 2 hrs annealing in air and finally heating at a ramp of 20° C. min. to 600° C. under $N_2$ purge of an $(AN)_{379}$-$(BA)_{527}$-$(AN)_{379}$ copolymer and a material prepared by the pyrolysis of an AN homopolymer on silica substrates, the molecular weight of the AN homopolymer is similar to the molecular weight of the AN blocks of the copolymer.

Comparison by Laser Raman Spectroscopy of Materials Prepared by Carbonization of poly(AN-b-BA-b-AN) Block Copolymer and a AN Homopolymer Laser Raman spectroscopy confirmed that the product of carbonization of pure copolymers has the graphitic structure analogous to one observed in traditional carbon fibers. Raman spectroscopy is commonly used to study the structure of carbon fibers [Tuinstra, F.; Koenig, J. L. J. Chem. Phys. 53(3), 1970, 1126; and Fung, A. W. P.; Rao, A. M.; Kuriyama, K.; Dresselhaus, M. S.; Dresselhaus, G.; Endo, M.; Shindo, N.J. Mater. Res. 1993, 489–500.] Two major bands are typically observed: G-band (1575 cm$^{-1}$) corresponding to graphitic carbon, and D-band (1354 cm$^{-1}$) corresponding to defective graphitic structures. The sample of the $(AN)_{379}$-$(BA)_{527}$-$(AN)_{379}$ copolymer prepared in example 3C and the sample of AN homopolymer, that was close to $M_w$ of AN blocks in a copolymer, were drop-deposited onto pre-cleaned silica substrates from 20 mg/mL solution in DMF and then subjected to 2 hrs vacuum annealing at 210° C. followed by 2 hrs annealing in air and finally 20° C. min. heating to 600° C. under $N_2$ purge. Raman spectra of both samples are shown in FIG. 17. The intensity of the spectrum of a homopolymer was rescaled to match the area under the spectrum of a copolymer. Both spectra closely resemble those reported in literature for carbon fibers. The material prepared from the copolymer sample has more pronounced G-band, indicating higher perfection of graphitic domains. Higher degree of order in the carbonized copolymer sample can be explained by less disruption during the evolution of gaseous products of pyrolysis, facilitated by the presence of empty spaces between carbon nanofibers left after pyrolysis of the fugitive poly(n-butyl acrylate) phase.

This increased perfection of the graphitic domains can also be extended to continuous graphitic structures if copolymers containing greater than 305 PAN or preferably more than 50% PAN or more preferably greater than 70% PAN are subjected to carbonization. The sacrificial domains form pores that act to vent gases formed during the cyclization and carbonization of the PAN continuous structure.

Example 8

Use of Carbonized Thin Films of poly(AN-b-BA-b-AN) in Fabrication and Resharpening of AFM Tips Carbon nanoclusters prepared according to this invention will additionally find use as ultra-sharp and robust tips for atomic force microscopy. A straightforward fabrication procedure for such tips applying the teachings of this application would involve deposition of ultra-thin precursor films onto appropriately shaped (e.g. truncated pyramid) standard AFM tips followed by thermal treatment.

Figure 18A:
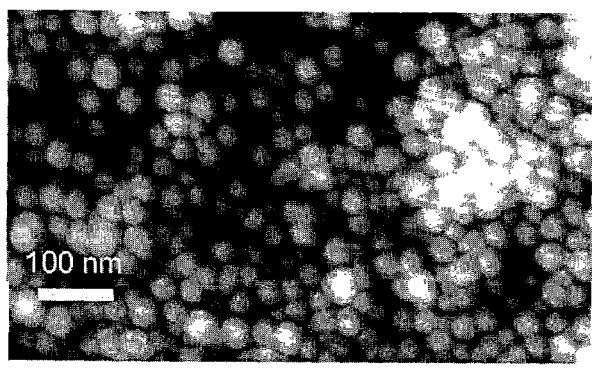
FIGS. 18A–18D are atomic force microscopy images of nanostructured material produced in Example 6A.
Figure 18B:
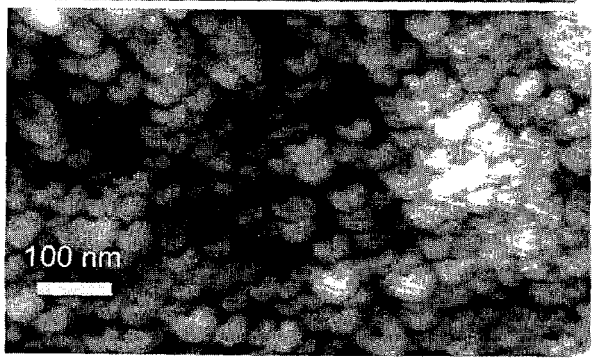
Figure 18C:
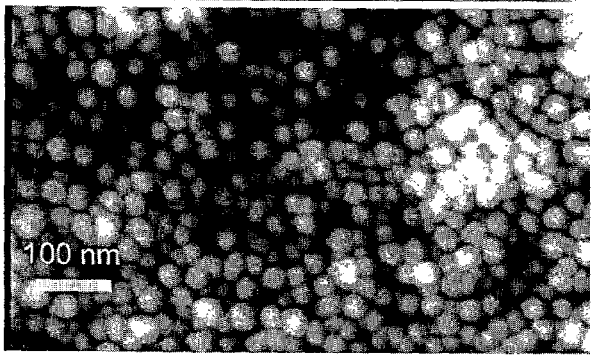

We herein provide an example of a procedure in which carbon "supertips" are formed at the apex of an AFM probe by mechanical transfer. It was noted that when the probe is scanned in contact mode over the array of nanoclusters prepared as described in example 6A, the sample was initially imaged with a standard silicon probe (nominal spring constant 50 Nm) in tapping mode, see FIG. 18A. Subsequently, the tip was purposefully blunted by crashing it into the surface. Imaging of exactly the same region of the sample, see FIG. 18B, confirmed that the tip apex was damaged. Thereafter, the probe was withdrawn and reengaged in contact mode and scanned while the set-point (the contact force) was increased gradually from the value corresponding to minimized force, when the set-point increase reached the value of 0.2–0.3 V (non-calibrated values of the detector signal), an abrupt improvement of image quality was observed. The probe was then withdrawn, reengaged again in tapping mode and used to image exactly the same test area as in previous tapping mode scans, see FIG. 18C. The quality of the tip was in all cases restored or even improved in comparison with the starting silicon probe. The described procedure could be carried out repeatedly with the same probe numerous times, each time resulting in formation of a sharp "supertip" giving high-quality AFM images.

Figure 18D:
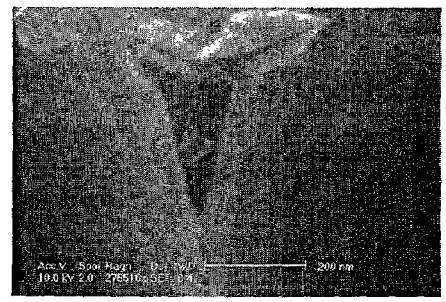

Field-emission SEM observations, see FIG. 18D, confirmed that the tips terated mechanically as described had the shape of truncated pyramid with few-nm "supertip" transferred from the carbon nanocluster array.

Carbon tips fabricated using this approach were used to image double-stranded DNA on mica. Imaging was carried out under the atmosphere of He gas, to minimize the effect of water condensation on the sample surface. The apparent width of DNA molecules, which is the measure of the sharpness of the AMF probe was in the range of 6–8 nm. In comparison, the apparent width of DNA imaged under similar conditions with standard silicon probes was ~2 nm higher.

Example 9

Carbon Structures with Meso-Pores

Example 9A

Synthesis of Brush Copolymers with poly(butyl acrylate-b-acrylonitrile blocks)

Example 9A1

Synthesis of a Brush with polyBA Grafts (nvt-brush1)

0.1 g macroinitiator containing 56% polyMMA and 44% polyBPEMA of molecular weight 56.66 kg/mol was dissolved in 20 ml degassed n-BA and 2 ml butanone. The solution was degassed by the FPT procedure (3 times), and while it was frozen, the flask was filled with nitrogen and 0.0183 g CuBr, 0.016 g $CuBr_2$ (5% vs. CuBr), and 0.106 g dNbpy were added. Then, the mixture was degassed again twice using the FPT procedure. The reaction was carried out at 70° C. Samples were taken after 62 and 90 h. After this time, the reaction mixture was dissolved in 30 ml THF, filtered through column filled with alumina (4–5 cm length), the alumina was washed with 30 ml THF and the solvent was removed from the combined solution.

The molecular weights of the obtained brush-like polymer increase nicely with as the reaction proceeds. No tailing was observed was observed in the GPC.

Example 9A2

Preparation of Brush with poly(BA-b-AN) Grafts (nvt-brush 2)

Reactants: the macroinitiator (nvt-brush 1)—1 g (0.4 mmol bromine end-groups); CuCl—0.0357 g (0.361 mmol); $CuCl_2$—0.0057 g (0.04 mmol; 10% of the total copper); Bpy—0.1258 g (0.8 mmol); acrylonitrile—30 ml; ethylene carbonate—10 ml. Reaction temperature, T=65° C.

The brush polymer was dissolved in AN and ethylene carbonate and the solution was degassed by FPT (3 times). The flask was then filled with nitrogen and while the mixture was frozen, the catalyst mixture was added. The FPT procedure was done one more time. Then the reaction was carried out at 65° C. After 19 h, the mixture became slightly heterogeneous (although, when poly(AN-b-BA-b-AN) is prepared, it is soluble in the AN, and it is not even necessary to add EC to make the system homogeneous). The reaction was stopped after 29 h. At that point some precipitated material could be seen. The results are given in the Table 9A2.

TABLE 9A2

| Time of polymerization, h | Conversion (GC) | $M_n$, kg/mol (DMF, vs. pMMA) | PDI |
|---|---|---|---|
| 0 (MI) | — | 234.99 | 1.27 |
| 19 (heterogeneous) | 0.107 | 589.74 | 2.14 |
| 29 (heterogeneous) | 0.138 | 1095.1 | 2.13* |

*There is a small additional peak corresponding to molecular weight of about 23 kg/mol The reaction was repeated using higher amount of ethylene carbonate so the entire system remained homogeneous.

Example 9A3

Synthesis of Azide-Terminated Brush with poly(BA-b-AN) Grafts (nvt-brush 2a)

A polymer containing azide end groups can be potentially crosslinked by irradiation of UV-light in solution. Under these conditions, it can be expected that the brush-type conformation of the polymer, with a crosslinked polyacrylonitrile shell, will be preserved after isolation. Thus, after pyrolysis a structure comprising fused hollow graphitic cylinders can be prepared.

0.5 g ($4.57 \times 10^{-7}$ mol, or $6.53 \times 10^{-5}$ mol bromine end groups) of the obtained in the previous example 9A2, (containing poly(BA-b-AN) grafts) was dissolved in 10 ml DMF. To this solution, 0.425 g (100-fold excess vs. the bromine groups) sodium azide was added and the mixture was stirred at 35° C. for two days (the flask was protected from light). At the end of the reaction, the color of the mixture was orange, and the solution was not homogeneous, indicating some possible crosslinking (or brush-brush coupling) even at these conditions. Then the polymer was precipitated in water, filtered and washed with water. This will be used further for photochemical crosslinking of the intramolecular phase separated molecule to stabilize the self-organized structure prior to pyrolysis.

Example 9A4

Synthesis of a Brush with polyBA Grafts (nvt-brush 3)

0.2 g macroinitiator containing 56% polyMMA and 44% polyBPEMA of molecular weight 56.66 kg/mol was dissolved in 30 ml degassed n-BA and 4 ml butanone. The solution was degassed by the freeze pump thaw procedure (3 times), and while it was frozen, the flask was filled with nitrogen and 0.0368 g CuBr, 0.0034 g $CuBr_2$ (5% vs. CuBr), and 0.2122 g dNbpy were added. Then, the mixture was degassed one more time using the FPT procedure. The reaction was carried out at 70° C. The evolution of molecular weight with polymerization time is presented in Table 9A4, and the GPC traces are showed a clean shift to higher molecular weight with monomer convertion. Molecular weights were determined using THF as the eluent for GPC, versus pMMA standards. At the end of the polymerization, the reaction mixture was dissolved in 50 ml THF, filtered through column filled with alumina (4–5 cm length), the alumina was washed with 30 ml THF and the solvent was removed from the combined solution.

TABLE 9A4

| Time of polymerization, h | $M_n \times 10^{-5}$, g/mol | PDI |
|---|---|---|
| 0 (macroinitiator) | 0.573 | 1.19 |
| 28 | 1.290 | 1.19 |
| 46 | 1.749 | 1.27 |
| 74 | 2.402 | 1.23 |
| 92 | 2.834 | 1.21 |

Example 9A5

Preparation of Brush with poly(BA-b-AN) Grafts (nvt-brush 4)

Reactants:

| | |
|---|---|
| macroinitiator (nvt-brush 3) | 0.5 g (0.25 mmol bromine end-groups) |
| CuCl | 0.0107 g (0.108 mmol); |
| $CuCl_2$ | 0.0025 g (0.019 mmol; 15% of the total copper; in experiment nvt-brush 3,10% was used) the total amount of copper is 0.5 vs. the bromine end-groups (in nvt-brush 3, it was 1:1); |
| Bpy | 0.0395 g (0.25 mmol); |
| acrylonitrile | 10 ml; ethylene carbonate—10 ml. |
| Reaction temperature, Th = 70° C. | |

The brush polymer was put in a Schlenk flask, which was then evacuated and filled with nitrogen. The catalyst was added (the flask was then evacuated and back-filled with nitrogen several times), followed by purged acrylonitrile and ethylene carbonate. Then the reaction was carried out at 70° C. After 17 h, the mixture became gel-like and it was difficult to stir it. The results are given in the next Table 9A5.

TABLE 9A5

| Time of polymerization, h | Conversion (GC) | $M_n$, kg/mol (DMF, vs. pMMA) | PDI |
|---|---|---|---|
| 5.5 | 0.219 | 144.7 | 1.29 |
| 17 (gel-like) | 0.439 | 183.4 | 1.44 |

The results are much better than in the previous experiment (in experiment nvt-brush 3, PDIs were above 2), although the reaction is fast. There was no significant problem with the homogeneity of the system and conversions of 44% were reached in 17 hours (in brush 3, maybe due to the insolubility of the polymer, only 14% conversion was achieved after 29 hours). Copolymers with high graft density can also be prepared.

We claim:

1. A process for the preparation of nanostructured materials, comprising:
    pyrolyzing a precursor, wherein the precursor comprises a self assembled phase-separated block copolymer to form a plurality of carbon nanostructures, wherein the carbon nanostructures are at least one of discrete carbon nanofibers, carbon nanotubes, and carbon nanocylinders, and wherein the block copolymer comprises:

at least one carbon precursor block; and
at least one sacrificial block, wherein the phase-separated copolymer separates on a molecular scale into at least one precursor phase and at least one sacrificial phase due to the immiscibility of the precursor and sacrificial blocks.

2. The process for the preparation of nanostructured materials of claim 1, wherein pyrolyzing the precursor comprises carbonizing the precursor material and pyrolyzing the sacrificial material.

3. The process for preparation of nanostructured materials of claim 1, wherein the precursor block comprises monomeric units derived from acrylonitrile based monomers.

4. The process for the preparation of nanostructured materials of claim 3, wherein the precursor comprises at least one phase of primarily precursor material and at least on phase of primarily sacrificial material.

5. The process for the preparation of nanostructured materials of claim 4, wherein pyrolyzing the precursor comprises heating the precursor to a temperature between 1000° F. and 1400° F.

6. The process for the preparation of nanostructured materials of claim 5, wherein heating the precursor is conducted in the absence of oxygen.

7. The process for preparation of nanostructured materials of claims 3, wherein the sacrificial material comprises monomeric units derived from butyl acrylate monomers.

8. The process for the preparation of nanostructured materials of claim 1, further comprising:
preparing a film comprising the precursor; and
heating the film.

9. The process for the preparation of nanostructured materials of claim 1, further comprising:
providing conditions for phase separating a copolymer.

10. The process for the preparation of nanostructured materials of claim 9, wherein the conditions for phase separating a polymer comprise at least one of phase separating the polymer in bulk, in solution, in the presence of a phase selective solvent, at an interface, on a surface, in the polymerization medium, under vacuum, at pressures above atmospheric pressure, in the absence of oxygen and by annealing.

11. The process for the preparation of nanostructured materials of claim 1, wherein the copolymer forms a phase separated morphology.

12. The process for the preparation of nanostructured materials of claim 11, wherein the phase separated morphology is well defined.

13. The process for the preparation on nanostructured material of claim 12, wherein one phase of the phase separated morphology comprises nanostructured domains.

14. The process for the preparation of nanostructured materials of claim 11, wherein the phase separate morphology comprises at least two phases.

15. The process for the preparation of nanostructured materials of claim 14, wherein at least one of the phases comprises cylindrical domains.

16. The process for the preparation of nanostructured materials of claim 14, further comprising:
annealing the precursor in the absence of oxygen.

17. The process for the preparation of nanostructured materials of claim 16, wherein the annealing the precursor reduces the surface energy of the phase separated morphology.

18. The process for the preparation of nanostructured materials of claim 14, further comprising:
doping at least one phase of the phase separated morphology.

19. The process for the preparation of nanostructured materials of claim 18, wherein the precursor comprises a stabilized mixture of copolymers and homopolymers.

20. The process for the preparation of nanostructured materials of claim 18, wherein the doping at least one phase of the phase separated morphology comprises doping with at least one material comprising at least one of Si, S, P, B, and a transition metal.

21. The process for the preparation of nanostructured material of claim 14, wherein at least one phase comprises a precursor for a catalyst.

22. The process for the preparation of nanostructured material of claim 21, wherein the precursor for a catalyst is different than the precursor for the nanostructured material.

23. The process for the preparation of nanostructured materials of claim 14, wherein one phase comprises at least one N atom and another phase comprises at least one B atom.

24. The process for the preparation of nanostructured materials of claim 11, wherein the phase separate morphology comprises at least one continuous phase.

25. The process for the preparation of nanostructured materials of claim 11, wherein the phase separate morphology comprises at least two continuous phases.

26. The process for the preparation of nanostructured materials of claim 11, wherein the phase separate morphology comprises three phases.

27. The process for the preparation of nanostructured materials of claim 26, wherein the phase separate morphology comprises at least one continuous phase.

28. The process for the preparation of nanostructured materials of claim 27, wherein the phase separate morphology comprises at least two continuous phases.

29. The process for the preparation of nanostructured materials of claim 11, further comprising stabilizing the phase separated morphology by heating in the presence of oxygen.

30. The process for the preparation of nanostructured materials of claim 1, wherein the phase separated copolymer comprises at least one copolymer selected from the group comprising an AB block copolymers, an ABA block copolymer, an ABC block copolymer, multiblock copolymers, a graft copolymer, symmetrical and asymetrical star copolymers, a multiarm block copolymer, (hyper)branched copolymers, brush copolymers, and a blend of polymers.

31. The process for the preparation of nanostructured materials of claim 30, wherein the phase separated copolymer comprises acrylonitrile monomer units in at least one polymer segments.

32. The process for the preparation of nanostructured materials of claim 30, wherein the phase separated copolymer comprises a gradient acrylonitrile copolymer segment.

33. The process for the preparation of nanostructured materials of claim 1, further comprising:
annealing the phase separated copolymer material; and
stabilizing the phase separated copolymer material.

34. The process for the preparation of nanostructured materials of claim 33, wherein the stabilizing the phase separated copolymer is performed by heating the phase separated copolymer in the presence of oxygen.

35. The process for the preparation of nanostructured materials of claim 1, wherein the phase separated copolymer comprises free radically (co)polymerizable monomers.

36. The process for the preparation of nanostructured materials of claim 35, wherein the free radically copolymerizable monomers comprise a functional group.

37. The process for the preparation of nanostructured materials of claim 36, wherein the functional group comprises a transition metal.

38. The process for the preparation of nanostructured materials of claim 35, wherein the free radically (co)polymerizable monomers comprise at least one of styrenes, (meth)acrylates and (meth)acrylonitrile.

39. The process for the preparation of nanostructured materials of claim 1, wherein the properties of the nanostructured material are affected by the molecular weight of the blocks of the phase separated copolymer material and the conditions of the carbonizing.

40. The process for the preparation of nanostructured materials of claim 1, wherein the nanostructured material comprises a two-dimensional array of carbon nanostructures.

41. The process for the preparation of nanostructured materials of claim 1, further comprising:
coating a surface with a film of a precursor comprising a phase separable copolymer.

42. The process for the preparation on nanostructured material of claim 41, wherein the nanostructured material is formed on the surface; and further comprising:
removing the nanostructured material from the surface.

43. The process for the preparation of nanostructured materials of claim 41, further comprising:
forming a two dimensional array of carbon nanostructures on the surface.

44. The process for the preparation of nanostructured material of claim 43, further comprising:
forming atomic force microscopy tips from the two dimensional array of carbon nanostructures on the surface.

45. The process for the preparation of nanostructured material of claim 43, further comprising:
functionalizing the tips of the carbon nanostructures.

46. The process for the preparation of nanostructured material of claim 45, wherein the tips are functionalized by coupling basic or hydrophobic functionalities to carboxyl groups attached to the carbon nanostructures.

47. The process for the preparation on nanostructured material of claim 43, wherein the two dimensional array is used to organize at least one of salts, dyes and responsive organic materials on the surface.

48. The process for the preparation of nanostructured materials of claim 43, wherein the carbon nanostructures are oriented perpendicular to the surface.

49. The process for the preparation of nanostructured materials of claim 48, wherein an aspect ratio of the carbon nanostructures is influenced by the thickness of the coating of the surface.

50. The process for the preparation of nanostructured materials of claim 43, wherein the carbon nanostructures are oriented substantially parallel to the surface.

51. The process for the preparation of nanostructured material of claim 43, wherein the surface is on a substrate and the two dimensional array of carbon nanostructures increases the thermal stability of the substrate.

52. The process for the preparation of nanostructured material of claim 43, further comprising:
infusing the two dimensional array of carbon nanostructures with a reactive species.

53. The process for the preparation of nanostructured material of claim 52, wherein the infused reactive species form an electrolyte.

54. The process for the preparation of nanostructured material of claim 52, further comprising:
adding an ionic species to form an electrolyte.

55. The process for the preparation of nanostructured material of claim 52, wherein the reactive species is comprises at least one of organic monomers and inorganic monomers.

56. The process for the preparation of nanostructured material of claim 55, wherein the reactive species comprises organic monomers.

57. The process for the preparation of nanostructured material of claim 55, wherein the reactive species comprises inorganic monomers.

58. The process for the preparation of nanostructured material of claim 52, wherein the reactive species are polymerizable.

59. The process for the preparation of nanostructured material of claim 58, further comprising:
polymerizing the reactive species.

60. The process for the preparation of nanostructured material of claim 58, wherein the surface is on a substrate and wherein polymerizing the reactive species forms a nanocomposite coating on the substrate.

61. The process for the preparation of nanostructured material of claim 60, further comprising:
removing the nanocomposite coating from the surface forming free standing structure.

62. The process for the preparation of nanostructured material of claim 52, the reactive species comprise an insulator.

63. The process for the preparation of nanostructured materials of claim 41, wherein the surface is on a substrate, and the surface is covered by the film.

64. The process for the preparation of nanostructured materials of claim 41, wherein the surface is on a substrate, and the surface is partially covered by the film.

65. The process for the preparation of nanostructured materials of claim 41, wherein the morphology of the precursor is influenced by the surface of the substrate.

66. The process for the preparation of nanostructured materials of claim 65, wherein the surface is on a substrate comprising a crystalline material.

67. The process for the preparation of nanostructured materials of claim 66, wherein the orientation of crystalline material influences the morphology of the precursor.

68. The process for the preparation of nanostructured materials of claim 41, wherein the surface is coated with one of an ultra thin film, a thin film, or a thick film of the phase separable material.

69. The process for the preparation of nanostructured materials of claim 68, further comprising:
annealing the phase separable material to form a phase separated material.

70. The process for the preparation of nanostructured materials of claim 69, wherein annealing the phase separable material is conducted in the absence of oxygen.

71. The process for the preparation of nanostructured materials of claim 70, wherein anneal the phase separated polymer material is conducted in a controlled environment or under reduced pressure.

72. The process for the preparation of nanostructured materials of claim 69, further comprising:
heating the phase separable material to stabilize the phase separation.

73. The process for the preparation of nanostructured materials of claim 72, wherein heating the phase separable material is conducted in the presence of oxygen.

74. The process for the preparation of nanostructured materials of claim 1, wherein the nanostructured materials comprise carbon nanostructures having adsorptive capacity.

75. The process for the preparation of nanostructured material of claim 74, wherein the carbon nanostructures function as an electronic tongue.

76. The process for the preparation of nanostructured materials of claim 1, wherein the phase separated copolymer material comprises a block copolymer having a block derived from at least two different monomer units.

77. The process for the preparation of nanostructured materials of claim 76, wherein at least one of the two different monomer units form a core in the phase separated polymer material.

78. The process for the preparation of nanostructured materials of claim 76, wherein the block derived from at least two different monomer units is a gradient copolymer block.

79. The process for the preparation of nanostructured materials of claim 1, wherein the phase separated copolymer material comprises a transition metal.

80. A high surface area carbon nanostructured material produced from the process of claim 79.

81. The process for the preparation of nanostructured materials of claim 79, wherein the transition metal is a complexed transition metal.

82. The process for the preparation of nanostructured materials of claim 81, wherein the nanostructured material comprises a catalyst.

83. The process for the preparation of nanostructured material of claim 1, wherein the nano structured material are for the manufacture of photovoltaic cells, supercapacitors, batteries, fuel cells, computer memory, carbon electrodes, carbon foams, actuators and materials for hydrogen storage.

84. The process for the preparation of nanostructured material of claim 1, further comprising:
    contacting the nanostructured material with a transition metal; and
    pyrolyzing the nanostructured material with the transition metal to form a carbide.

85. The process for the preparation of nanostructured material of claim 84, wherein the transition metal is a transition metal salt.

86. The process for the preparation of nanostructured materials of claim 1, wherein the nanostructured material comprises two dimensional array of carbon nanotubes.

87. The process for the preparation of nanostructured materials of claim 86, wherein at least a portion of the nanostructured material is incorporated in flat panel display.

88. The process of claim 1, wherein the nanostructured material is used for supercapacitor electrodes.

89. A high surface area carbon nanostructured material produced from the process of claim 1.

90. The process for the preparation of nanostructured materials of claim 1, wherein an array of carbon nanostructures is formed on a substrate; and, further comprising:
    infusing the array with a transition metal; and
    pyrolyzing the array.

91. The process of claim 90, wherein the transition metal forms a semiconductor on the substrate.

92. The process of claim 90, wherein the transition metal forms a conductor on the substrate.

* * * * *

UNITED STATES PATENT AND TRADEMARK OFFICE
CERTIFICATE OF CORRECTION

PATENT NO. : 7,056,455 B2
APPLICATION NO. : 10/118519
DATED : June 6, 2006
INVENTOR(S) : Krzysztof Matyjaszewski et al.

It is certified that error appears in the above-identified patent and that said Letters Patent is hereby corrected as shown below:

Column 1, Line 5, insert --04/06/2001--

Column 8, Line 43, delete "Tr" and insert --$\pi$--

Column 8, Line 48, delete "Tr" and insert --$\pi$--

Column 8, Line 50, delete "Tr" and insert --$\pi$--

Column 8, Line 52, delete "Tr" and insert --$\pi$--

Column 8, Line 54, delete "Tr" and insert --$\pi$--

Column 15, Line 24, insert --use-- between "for in"

Column 19, Line 20, insert --in-- between "concentrated a"

Column 19, Line 54, delete "ratio's" and insert --ratios--

Column 21, Line 12, delete "lease" and insert --least--

Column 31, Line 23, delete "6" and insert --$\delta$--

Column 31, Line 47, delete "anba1 5" and insert --anba 15--

Column 31, Line 61, delete "10$^-$" and insert --10$^{-6}$--

Column 34, Line 20, delete "heck" and insert --check--

Column 40, Line 45, delete "1 min" and insert --/min--

Column 43, Line 10, delete "MI" and insert --M1--

Column 45, Line 51, delete "on" and insert --of--

Column 47, Line 25, delete "on" and insert --of--

Column 47, Line 45, delete "on" and insert --of--

UNITED STATES PATENT AND TRADEMARK OFFICE
CERTIFICATE OF CORRECTION

PATENT NO. : 7,056,455 B2
APPLICATION NO. : 10/118519
DATED : June 6, 2006
INVENTOR(S) : Krzysztof Matyjaszewski et al.

It is certified that error appears in the above-identified patent and that said Letters Patent is hereby corrected as shown below:

Column 48, Line 8, delete "is"

Column 48, Line 61, delete "anneal" and insert --annealing--

Signed and Sealed this

Seventeenth Day of February, 2009

JOHN DOLL
*Acting Director of the United States Patent and Trademark Office*